(12) United States Patent
Timpe et al.

(10) Patent No.: US 7,560,221 B2
(45) Date of Patent: Jul. 14, 2009

(54) LITHOGRAPHIC PRINTING PLATE PRECURSORS WITH MERCAPTO-FUNCTIONALIZED FREE-RADICAL POLYMERIZABLE MONOMERS

(75) Inventors: Hans-Joachim Timpe, Osterode/Harz (DE); Ursula Muller, Herzberg am Harz (DE)

(73) Assignee: Kodak Graphic Communications GmbH, Osterode (DE)

( * ) Notice: Subject to any disclaimer, the term of this patent is extended or adjusted under 35 U.S.C. 154(b) by 0 days.

(21) Appl. No.: 10/586,509

(22) PCT Filed: Jan. 19, 2005

(86) PCT No.: PCT/EP2005/000489

§ 371 (c)(1),
(2), (4) Date: Jul. 18, 2006

(87) PCT Pub. No.: WO2005/071488

PCT Pub. Date: Aug. 4, 2005

(65) Prior Publication Data

US 2007/0148583 A1    Jun. 28, 2007

(30) Foreign Application Priority Data

Jan. 21, 2004 (DE) ........................ 10 2004 003 143

(51) Int. Cl.
G03F 7/004 (2006.01)
G03F 7/027 (2006.01)
G03F 7/028 (2006.01)
G03F 7/033 (2006.01)

(52) U.S. Cl. ................. 430/302; 430/270.1; 430/281.1; 430/300; 430/921; 430/944

(58) Field of Classification Search .............. 430/270.1, 430/281.1, 284.1, 287.1, 302, 906, 908, 921, 430/922, 944

See application file for complete search history.

(56) References Cited

U.S. PATENT DOCUMENTS

| | | | | |
|---|---|---|---|---|
| 5,273,862 | A | * | 12/1993 | Zertani et al. ............. 430/273.1 |
| 5,284,735 | A | * | 2/1994 | Okamoto .................. 430/281.1 |
| 5,514,521 | A | * | 5/1996 | Kobayashi ................ 430/281.1 |
| 5,629,354 | A | * | 5/1997 | West et al. ..................... 522/25 |
| 5,695,908 | A | * | 12/1997 | Furukawa ................... 430/205 |
| 5,919,600 | A | * | 7/1999 | Huang et al. .............. 430/272.1 |
| 6,306,555 | B1 | * | 10/2001 | Schulz et al. ............. 430/270.1 |
| 6,309,792 | B1 | * | 10/2001 | Hauck et al. ............. 430/270.1 |
| 2002/0020832 | A1 | * | 2/2002 | Oka et al. ..................... 252/500 |
| 2002/0197564 | A1 | | 12/2002 | Timpe et al. ............. 430/284.1 |

FOREIGN PATENT DOCUMENTS

DE        23 61 769 A        6/1975

JP        11-116900    *    4/1999

OTHER PUBLICATIONS

A. Furukawa et al., "Design and synthesis of highly photopolymerizable styrenyl compounds in solid-state photoinitiated polymerization" J. Polymer Science, Part A; Polymer Chemistry, vol. 41, No. 21, 2003, pp. 3227-3242.

* cited by examiner

Primary Examiner—Cynthia H Kelly
Assistant Examiner—Anca Eoff
(74) Attorney, Agent, or Firm—J. Lanny Tucker

(57) ABSTRACT

Lithographic printing plate precursor comprising: a) an untreated or pretreated substrate and b) a radiation-sensitive coating comprising: (i) at least one polymeric binder soluble or swellable in aqueous alkaline developers; (ii) at least one free-radical polymerizable monomer and/or oligomer comprising at least one non-aromatic C—C double bond and at least one SH group in the molecule; and (iii) a radiation-sensitive initiator or initiator system for free-radical polymerization, wherein component (ii) has the formula (I) wherein each $R^{1a}$, $R^{1b}$ and $R^{1c}$ is independently selected from H, $C_1$-$C_6$ alkyl, $C_2$-$C_8$ alkenyl, aryl, halogen, CN and $COOR^{1d}$, wherein $R^{1d}$ is H, $C_1$-$C_{18}$ alkyl, $C_2$-$C_8$ alkenyl, $C_2$-$C_8$ alkynyl or aryl; and Z is an aliphatic, heterocyclic or heteroaromatic spacer or a combination of two or more thereof, wherein Z can optionally comprise one or more additional SH groups and/or one or more additional non-aromatic C—C double bonds; and each $Z^1$ is independently selected from a single bond, formulae (Ia), (Ib), (Ic), (Id), (Ie), (If), (Ig), (Ih), (Ij), (Ik), (Im), (In), (Io), (Ip), (Iq), (Ir), (Is), (It), (Iu), (Iv), wherein $R^{2a}$, $R^{2b}$ and $R^{2c}$ are independently selected from H, $C_1$-$C_6$ alkyl and aryl, $Z^2$ is selected from a single bond, O, S and $NR^{2c}$, $Z^3$ is a single bond which is connected to Z, b is an integer from 1 to 10 and c is an integer from 1 to 3.

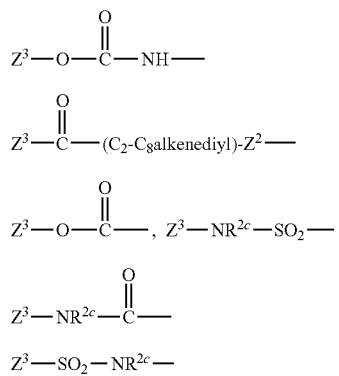
21 Claims, No Drawings

LITHOGRAPHIC PRINTING PLATE PRECURSORS WITH MERCAPTO-FUNCTIONALIZED FREE-RADICAL POLYMERIZABLE MONOMERS

The present invention relates to negative working lithographic printing plate precursors, in particular precursors whose radiation-sensitive coating comprises mercapto-functionalized free-radical polymerizable monomers; the invention furthermore relates to a process for their production as well as to a process for imaging such precursors.

The technical field of lithographic printing is based on the immiscibility of oil and water, wherein the oily material or the printing ink is preferably accepted by the image area, and the water or fountain solution is preferably accepted by the non-image area. When an appropriately produced surface is moistened with water and a printing ink is applied, the background or non-image area accepts the water and repels the printing ink, while the image area accepts the printing ink and repels the water. The printing ink in the image area is then transferred to the surface of a material such as paper, fabric and the like, on which the image is to be formed. Generally, however, the printing ink is first transferred to an intermediate material, referred to as blanket, which then in turn transfers the printing ink onto the surface of the material on which the image is to be formed; this technique is referred to as offset lithography.

A frequently used type of lithographic printing plate precursor (in this context the term printing plate precursor refers to a coated printing plate prior to exposure and developing) comprises a photosensitive coating applied onto a substrate on aluminum basis. The coating can react to radiation such that the exposed portion becomes so soluble that it is removed during the developing process. Such a plate is referred to as positive working. On the other hand, a plate is referred to as negative working if the exposed portion of the coating is hardened by the radiation. In both cases, the remaining image area accepts printing ink, i.e. is oleophilic, and the non-image area (background) accepts water, i.e. is hydrophilic. The differentiation between image and non-image areas takes place during exposure.

In conventional plates, a film containing the information to be transferred is attached to the plate precursor under vacuum in order to guarantee good contact. The plate is then exposed by means of a radiation source, part of which is comprised of UV radiation. When a positive printing plate precursor is used, the area on the film corresponding to the image on the plate is so opaque that the light does not reach the plate, while the area on the film corresponding to the non-image area is clear and allows light to permeate the coating, whose solubility increases. In the case of a negative plate, the opposite takes place: The area on the film corresponding to the image on the plate is clear, while the non-image area is opaque. The coating beneath the clear film area is hardened due to the incident light, while the area not affected by the light is removed during developing. The light-hardened surface of a negative working plate is therefore oleophilic and accepts printing ink, while the non-image area that used to be coated with the coating removed by the developer is desensitized and therefore hydrophilic.

For several decades, positive working commercial printing plate precursors have been characterized by the use of alkali-soluble phenolic resins and naphthoquinone diazide derivatives; imaging was carried out with UV radiation.

Recent developments in the field of lithographic printing plate precursors have led to radiation-sensitive compositions suitable for the production of printing form precursors which can be addressed directly by lasers. The digital image-forming information can be used to convey an image onto a printing form precursor without the use of a film, as is common in conventional plates. Often, these digitally addressable precursors are IR-sensitive precursors which are imaged by means of IR lasers.

UV-sensitive imageable elements, such as e.g. lithographic printing plate precursors, are for example described in DE 44 18 645 C1, DE 195 25 050 C2 and EP 0 838 478 B1.

Regarding IR-sensitive imageable elements, reference is for example made to DE 199 06 823 C2, EP 0 672 544 A1, EP 1 129 845 A2, U.S. Pat. Nos. 5,491,046 A and 6,391,524 B2.

It is known that mercapto compounds, such as e.g. 3-mercapto-1,2,4-triazole, 2-mercaptobenzoxazole, 2-mercaptobenzthiazole, 2-mercaptoimidazole, 2-mercapto-5-phenyl-1,3,4-oxadiazole or 5-mercapto-1-methyl-1H-tetrazole, can be used as chain-transfer agents in radiation-sensitive coatings which are sensitive in the wavelength ranges of UV to IR and which furthermore comprise free-radical polymerizable monomers (see e.g. U.S. Pat. Nos. 4,410,621, 4,937,159, EP 0 889 363, US 2002/0025489 A1). In all these cases, compositions are described wherein the mercapto compound and the free-radical polymerizable monomer are used as separate components in the composition.

U.S. Pat. No. 6,569,603 describes photosensitive compositions whose polymeric binders are produced using mercapto-substituted comonomers. The use of such mercapto-substituted monomers as polymerizable monomer component in radiation-sensitive coatings of imageable elements, such as printing plate precursors, is not described.

U.S. Pat. No. 5,115,032 describes low-odor compounds synthesized by reacting thiols and multi-functional C—C unsaturated compounds whose C—C double bonds have to exhibit different degrees of reactivity. These compounds are then used in paints, adhesives, and the like.

In U.S. Pat. No. 6,562,543 B2, compounds with one or two N-containing heterocyclic rings with a double bond in the ring, compounds with a primary, secondary or tertiary amino group and compounds with a thiol group are used as stabilizers for radiation-sensitive compositions comprising an organic borate salt as initiator; the stabilizer prevents the thermal decomposition of the borate. In stabilizers with an amino group of the formula $R_5R_6R_7N$ or with a thiol group of the formula $R_8$-SX the groups $R_5$ to $R_8$ can be selected as desired. No information is given regarding radiation sensitivity.

It is the object of the present invention to provide lithographic printing plate precursors exhibiting a markedly improved radiation sensitivity.

This object is achieved by a lithographic printing plate precursor comprising
 a) an untreated or pretreated substrate and
 b) a radiation-sensitive coating comprising
  (i) at least one polymeric binder soluble or swellable in aqueous alkaline developers;
  (ii) at least one free-radical polymerizable monomer and/or oligomer comprising at least one non-aromatic C—C double bond and at least one SH group in the molecule; and
  (iii) a radiation-sensitive initiator or initiator system for free-radical polymerization, wherein component (ii) has the following formula (I):

$$\text{HS-Z-}(Z^1\text{-}CR^{1a}\text{=}CR^{1b}R^{1c})_c \tag{I}$$

wherein each $R^{1a}$, $R^{1b}$ and $R^{1c}$ is independently selected from H, $C_1$-$C_6$ alkyl, $C_2$-$C_8$ alkenyl, aryl, halogen, CN and $COOR^{1d}$, wherein $R^{1d}$ is H, $C_1$-$C_{18}$ alkyl, $C_2$-$C_8$ alkenyl, $C_2$-$C_8$ alkynyl or aryl; and Z is an aliphatic, heterocyclic or heteroaromatic spacer or a combination of two or more thereof, wherein Z can optionally comprise one or more additional SH groups and/or one or more additional non-aromatic C—C double bonds; and each $Z^1$ is independently selected from a single bond,

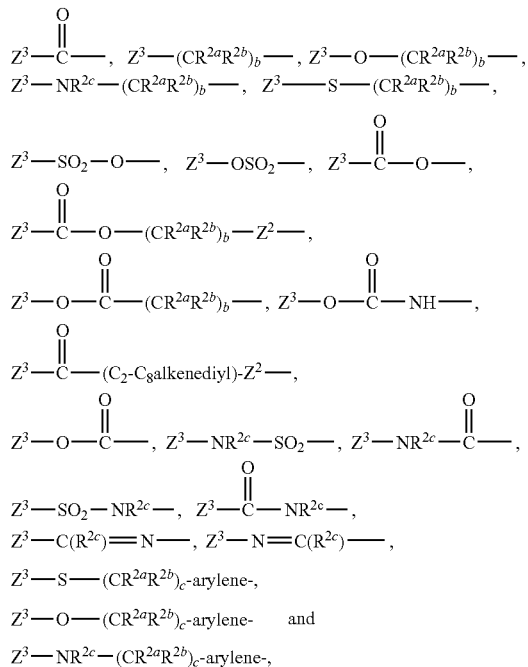

wherein $R^{2a}$, $R^{2b}$ and $R^{2c}$ are independently selected from H, $C_1$-$C_6$ alkyl and aryl, $Z^2$ is selected from a single bond, O, S and $NR^{2c}$, $Z^3$ is a single bond which is connected to Z, b is an integer from 1 to 10 and c is an integer from 1 to 3.

The lithographic printing plate precursors according to the present invention are described in more detail in the following.

Unless defined otherwise, the term "alkyl group" as used in the present invention refers to a straight-chain, branched or cyclic saturated hydrocarbon group preferably comprising 1 to 18 carbon atoms, especially preferred 1 to 10 carbon atoms and most preferred 1 to 6 carbon atoms. The alkyl group can optionally comprise one or more substituents (preferably 0 or 1 substituent) selected for example from halogen atoms (fluorine, chlorine, bromine, iodine), CN, $NO_2$, $NR^{IV}_2$, $COOR^{IV}$, $SR^{IV}$ and $OR^{IV}$ ($R^{IV}$ independently represents a hydrogen atom or an alkyl group). The above definition also applies to the alkyl unit of an aralkyl group and an alkoxy group.

Unless defined otherwise, the term "alkenyl group" as used in the present invention refers to a straight-chain, branched or cyclic hydrocarbon group with a C—C double bond, preferably comprising 2 to 18 carbon atoms, especially preferred 2 to 10 carbon atoms and most preferred 2 to 6 carbon atoms. The alkenyl group can optionally comprise one or more substituents (preferably 0 or 1 substituent) selected for example from halogen atoms (fluorine, chlorine, bromine, iodine), CN, $NO_2$, $NR^{IV}_2$, $COOR^{IV}$, $SR^{IV}$ and $OR^{IV}$ ($R^{IV}$ independently represents a hydrogen atom or an alkyl group). The above definition also applies to an alkenediyl group.

Unless defined otherwise, the term "alkynyl group" as used in the present invention refers to a straight-chain or branched hydrocarbon group with a C—C triple bond, preferably comprising 2 to 18 carbon atoms, especially preferred 2 to 10 carbon atoms and most preferred 2 to 6 carbon atoms. The alkynyl group can optionally comprise one or more substituents (preferably 0 or 1 substituent) selected for example from halogen atoms (fluorine, chlorine, bromine, iodine), CN, $NO_2$, $NR^{IV}_2$, $COOR^{IV}$, $SR^{IV}$ and $OR^{IV}$ ($R^{IV}$ independently represents a hydrogen atom or an alkyl group).

Unless defined otherwise, the term "aryl group" as used in the present invention refers to an aromatic carbocyclic group with one or more fused rings, which preferably comprises 6 to 14 carbon atoms. The aryl group can optionally comprise one or more substituents (preferably 0 to 3) selected for example from halogen atoms, alkyl groups, CN, $NO_2$, $NR^{IV}_2$, $COOR^{IV}$, $SO_3H$, $OR^{IV}$ and $SR^{IV}$ (wherein each $R^{IV}$ is independently selected from hydrogen and alkyl). The above definition also applies to the aryl unit of an aralkyl group. Examples include phenyl, tolyl, xylyl, 2- or 4-alkylphenyl, such as 2-methylphenyl, 4-ethylphenyl and 4-t-butylphenyl, 2- or 4-alkoxyphenyl, such as 2-methoxyphenyl, 4-methoxyphenyl, 4-dialkylaminophenyl, naphthyl and 4-alkylnaphthyl. Preferred examples are a phenyl group and a naphthyl group which can optionally be substituted. The above definition also applies to arylene groups (i.e. divalent aromatic groups); examples thereof are 1,4-phenylene, 3-methyl-1,4-phenylene, 2-methoxy-1,4-phenylene, 1,3-phenylene, 4-cyano-1,3-phenylene, 1,4-naphthylene, 1,5-naphthylene, 4-dimethylamino-1,5-naphthylene and 9,10-phenanthrenylene (especially preferred are 1,4-phenylene and 1,3-phenylene).

Unless defined otherwise, the term "heterocyclic group" as used in the present invention refers to a saturated or unsaturated (non-aromatic) cyclic group, wherein one or more C atoms in the ring are replaced with heteroatoms selected from O, S, Se, Te and N, preferably O, S and N; preferably, one or two C atoms are replaced. Preferably, the heterocyclic group is a 5- or 6-membered ring. The heterocyclic group can optionally comprise one or more substituents (bonded to a C atom and/or to an N atom). Preferably, the heterocyclic group is unsubstituted or comprises one substituent. The optional substituents are preferably selected from halogen atoms, alkyl groups, CN, $NO_2$, $NR^{IV}_2$, $OR^{IV}$ and $SR^{IV}$, wherein each $R^{IV}$ is independently selected from hydrogen and alkyl. Examples of heterocyclic groups include piperidyl, piperazinyl, tetrahydroquinolinyl, pyrrolidyl, tetrahydrofurfuryl, tetrahydro-pyranyl, morpholinyl and tetrahydrothiophenyl.

Unless defined otherwise, the term "heteroaromatic group" as used in the present invention refers to an aryl group wherein one or more ring carbon atoms are replaced with heteroatoms selected from O, S, Se, Te and N, preferably O, S and N; preferably, one, two or three carbon atoms are replaced. The heteroaromatic group can optionally comprise one or more substituents which are preferably selected from halogen atoms, alkyl groups, CN, $NR^{IV}_2$, $COOR^{IV}$, $OR^{IV}$ and $SR^{IV}$ (especially preferred from alkyl groups, $OR^{IV}$ and $SR^{IV}$), wherein each $R^{IV}$ is independently selected from hydrogen and alkyl. The substituents can be bonded to C atoms and/or N atoms. Examples of heteroaromatic groups include imidazolyl, 1,2,4-triazolyl, pyrazolyl, 1,3-thiazolyl, pyridyl, quinolinyl, pyrimidyl, 1,3,4-thiadiazolyl, 1,3,4-oxadiazolyl, 1,3,5-triazinyl, benzimidazolyl, acridinyl, furanyl and thienyl.

A dimensionally stable plate or foil-shaped material is preferably used as a lithographic substrate. A lithographic substrate is used as dimensionally stable plate or foil-shaped material that has been known to the person skilled in the art as a substrate for lithographic printing plates. Examples of such substrates include paper, paper coated with plastic materials (such as polyethylene, polypropylene, polystyrene), a metal plate or foil, such as e.g. aluminum (including aluminum alloys), plastic films made e.g. from cellulose diacetate, cellulose triacetate, cellulose propionate, cellulose acetate, cellulose acetate butyrate, cellulose nitrate, polyethylene terephthalate, polyethylene, polystyrene, polypropylene, polycarbonate and polyvinyl acetate, and a laminated material made from paper or a plastic film and one of the above-mentioned metals, or a paper/plastic film that has been metallized by vapor deposition. Among these substrates, an aluminum plate or foil is especially preferred since it shows a remarkable degree of dimensional stability, is inexpensive and furthermore exhibits excellent adhesion to the coating. Furthermore, a composite film can be used wherein an aluminum foil has been laminated onto a polyethylene terephthalate film.

A metal substrate, in particular an aluminum substrate, is preferably subjected to a surface treatment, for example graining by brushing in a dry state or brushing with abrasive suspensions, or electrochemical graining, e.g. by means of a hydrochloric acid electrolyte, and optionally anodizing.

Furthermore, in order to improve the hydrophilic properties of the surface of the metal substrate that has been grained and optionally anodized in sulfuric acid or phosphoric acid, the metal substrate can be subjected to an after treatment with an aqueous solution of e.g. sodium silicate, calcium zirconium fluoride, polyvinylphosphonic acid or phosphoric acid. Within the framework of the present invention, the term "substrate" encompasses both untreated and pretreated substrates, for example those exhibiting a hydrophilizing layer on their surface.

The details of the above-mentioned substrate pre-treatment are well known to the person skilled in the art.

The polymeric binder soluble or swellable in aqueous alkaline developer is an essential component of the radiation-sensitive coating. Basically all polymers or polymer mixtures known in the technical field of radiation-sensitive compositions can be used as polymeric binders for the radiation-sensitive coating. Linear organic polymers soluble or swellable in water or in aqueous alkaline solutions are especially suitable. Suitable binders are described for example in EP 170 123 A1. Acrylic acid copolymers, methacrylic acid copolymers, itaconic acid copolymers, crotonic acid copolymers, maleic acid copolymers, partially esterified copolymers of maleic acid and acidic cellulose derivatives are particularly suitable. Preferably, the polymers have a weight-average molecular weight in the range of 10,000 to 1,000,000 (determined by means of GPC). In view of possible problems occurring in connection with ink acceptance during the printing process, it is preferred that the used polymer have an acid number of >70 mg KOH/g, or, when polymer mixtures are used, that the arithmetic average of the individual acid numbers be >70 mg KOH/g. A polymer or polymer mixture with an acid number of >110 mg KOH/g is more preferred; especially preferred is an acid number between 140 and 160 mg KOH/g. However, polymeric binders without an acid number can be used as well. Such polymers are for example described in US 2003/0124460 A1. The content of the polymeric binder in the radiation-sensitive coating preferably accounts for 25 to 60 wt.-%, more preferably 30 to 45 wt.-%, based on the dry layer weight.

Of course, a mixture of polymeric binders can be used as well; in that case, the amounts given refer to the total amount of polymeric binder.

The polymeric binder can comprise functional groups, however, no SH groups. While novolaks are soluble in aqueous alkaline developers, they are not particularly suitable as polymeric binders.

It is essential to the present invention that the coating comprise at least one free-radical polymerizable compound with at least one non-aromatic (i.e. free-radical polymerizable) C=C double bond and at least one SH group in the molecule (in the following also briefly referred to as "SH monomer") which is represented by the following formula (I)

wherein each $R^{1a}$, $R^{1b}$ and $R^{1c}$ is independently selected from H, $C_1$-$C_6$ alkyl, $C_2$-$C_8$ alkenyl, aryl, halogen, CN and $COOR^{1d}$, wherein $R^{1d}$ is H, $C_1$-$C_{18}$ alkyl, $C_2$-$C_8$ alkenyl, $C_2$-$C_8$ alkynyl or aryl; and Z is an aliphatic, heterocyclic or heteroaromatic spacer or a combination of two or more thereof, wherein Z can optionally comprise one or more additional SH groups and/or one or more additional non-aromatic C=C double bonds; and each $Z^1$ is independently selected from a single bond,

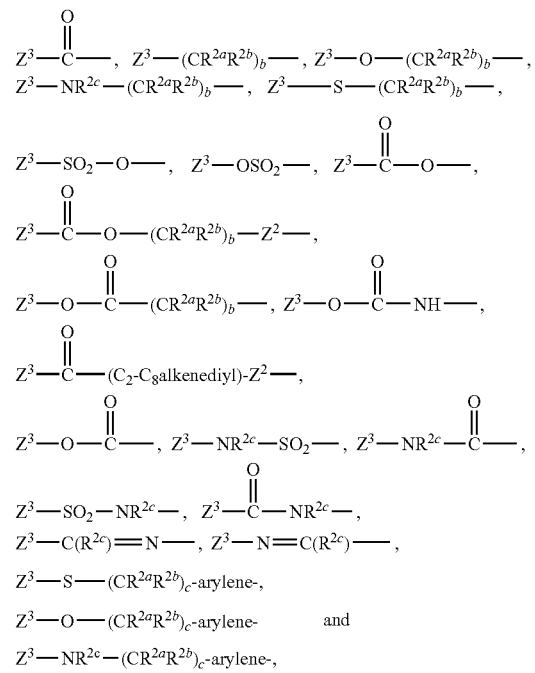

wherein $R^{2a}$, $R^{2b}$ and $R^{2c}$ are independently selected from H, $C_1$-$C_6$ alkyl and aryl, $Z^2$ is selected from a single bond, O, S and $NR^{2c}$, $Z^3$ is a single bond which is connected to Z, b is an integer from 1 to 10 and c is an integer from 1 to 3.

Depending on c, Z represents a divalent, trivalent or tetravalent group.

$R^{1a}$ is preferably selected from H, $C_1$-$C_6$ alkyl, or $COOR^{1d}$, and especially preferred it represents H, methyl or COOH.

$R^{1b}$ and $R^{1c}$ are independently preferably H, $C_1$-$C_6$ alkyl or $COOR^{1d}$, particularly preferred hydrogen, methyl or —$COOCH_3$.

$R^{1d}$ is preferably H, $C_1$-$C_6$ alkyl or $C_2$-$C_6$ alkenyl, especially preferred hydrogen, methyl or —$CH_2$—CH=$CH_2$.

$Z^1$ is preferably a single bond, $Z^3$-$(CR^{2a}R^{2b})_b$ wherein b=1,

wherein b=1 or 2, especially preferred a single bond, —$CH_2$— or

Z is preferably a 1,3,4-thiadiazole group (if c=1, the SH group shown in formula (I) and $Z^1$ are preferably in the 2,5 position in the thiadiazole ring), a 1,2,4-triazole group (if c=1, the SH group shown in formula (I) and $Z^1$ are preferably in the 3,5 position in the triazole ring) or a 1,3,5-triazine group (if c=1, the SH group shown in formula (I) and $Z^1$ are preferably in the 2,4 position in the triazine ring; if c=2, the SH group shown in formula (I) and the two groups $Z^1$ are in the 2,4,6 position in the triazine ring); of these compounds, a 1,3,4-thiadiazole group or a 1,3,5-triazine group, are especially preferred, wherein the binding sites with SH and $Z^1$ are as described above.

$R^{2a}$ and $R^{2b}$ are independently preferably H, $C_1$-$C_3$ alkyl or phenyl, especially preferred hydrogen or methyl.

$R^{2c}$ is preferably hydrogen, $C_1$-$C_3$ alkyl or phenyl, especially preferred hydrogen or methyl.

b is preferably 1 to 6, especially preferred 1 or 2.

c is preferably 1 or 2, especially preferred 1.

According to one embodiment, the compound of formula (I) comprises a total of 2 SH groups and one non-aromatic C—C double bond. The second SH group is preferably in the Z unit of the general structure (I). It is especially preferred that Z represent 1,3,5-triazinyl substituted with SH, which results in a compound of formula (I) with a total of 2 SH groups.

According to another embodiment, the compound of formula (I) comprises an SH group and two or more non-aromatic free-radical polymerizable C—C double bonds. The non-aromatic free-radical polymerizable C—C double bond(s) in addition to those shown in formula (I) can either be in the unit Z, or one of the groups $R^{1a}$, $R^{1b}$ and $R^{1c}$ represents $COOR^{1d}$, wherein $R^{1d}$ is a $C_2$-$C_8$ alkenyl group, or c in formula (I) represents 2 or 3. It is especially preferred that Z represent 1,3,5-triazinyl comprising a substituent with a non-aromatic C—C double bond.

Specific examples of SH monomers are the following:
2-Thio(4-ethenyl)benzyl-5-mercapto-1,3,4-thiadiazole
2-thio(4-methyl-crotonato)-5-mercapto-1,3,4-thiadiazole
2-thio(4-ethenyl)benzyl-4,6-dimercapto-1,3,5-triazine
2,4-di-thio(4-ethenyl)benzyl-6-mercapto-1,3,5-triazine
2-thio(4-methacroylmethylene)benzyl-5-mercapto-1,3,4-thiadiazole
3-thio(4-ethenyl)benzyl-5-mercapto-1,2,4-triazole.

The SH monomers are preferably present in an amount of 10 to 55 wt.-%, based on the dry layer weight of the radiation-sensitive coating, especially preferred 15 to 35 wt.-%. If a mixture of different SH monomers is used, the amounts given refer to the total amount of SH monomers.

Optionally, in addition to the SH monomers, the radiation-sensitive composition can comprise further monomers/oligomers with a free-radical polymerizable C—C double bond which do not contain SH groups.

All monomers and oligomers with C—C double bonds or triple bonds which are free-radical polymerizable and comprise at least one C—C double bond or triple bond can be used as optional C—C unsaturated monomers/oligomers without SH groups. Such compounds are well known to the person skilled in the art and can be used in the present invention without any particular limitations. Esters of acrylic and methacrylic acids, itaconic acid, crotonic acid, isocrotonic acid, maleic acid and fumaric acid with one or more unsaturated groups in the form of monomers, oligomers or prepolymers are preferred. They may be present in solid or liquid form, with solid and highly viscous forms being preferred. Compounds suitable as monomers include for instance trimethylol propane triacrylate and methacrylate, pentaerythritol triacrylate and methacrylate, dipentaerythritolmonohydroxy pentaacrylate and methacrylate, dipentaerythritol hexaacrylate and methacrylate, pentaerythritol tetraacrylate and methacrylate, ditrimethylol propane tetraacrylate and methacrylate, diethyleneglycol diacrylate and methacrylate, triethyleneglycol diacrylate and methacrylate or tetraethyleneglycol diacrylate and methacrylate. Suitable oligomers and/or prepolymers are for example urethane acrylates and methacrylates, epoxide acrylates and methacrylates, polyester acrylates and methacrylates, polyether acrylates and methacrylates or unsaturated polyester resins.

Other suitable unsaturated free-radical polymerizable compounds are e.g. unsaturated amides, such as 1,6-hexamethylene-bis-acrylamide, vinyl esters, such as divinyl succinate or divinyl phthalate, styrene, divinyl styrene or derivatives thereof, N-vinyl monomers, such as N-vinylcarbazole or N-vinylpyrrolidone.

In addition to monomers and/or oligomers, use can also be made of polymers comprising free-radical polymerizable C—C double bonds in the main or side chains. Examples thereof include reaction products of maleic acid anhydride olefin copolymers and hydroxyalkyl(meth)acrylates; polyesters comprising an allyl alcohol ester group; reaction products of polymeric polyalcohols and isocyanato(meth)acrylates; unsaturated polyesters; (meth)acrylate-terminated polystyrenes, poly(meth)acrylic acid ester, poly(meth)acrylic acids, poly(meth)acrylamides and polyethers. In this connection, the prefix "(meth)" indicates that both derivatives of acrylic acid and of methacrylic acid can be used.

Additional suitable C—C-unsaturated free-radical polymerizable compounds without SH groups are e.g. described in EP 176 007 A1.

The optional free-radical polymerizable monomers/oligomers without SH groups are preferably present in an amount of 20 to 70 wt.-%, based on the dry layer weight of the radiation-sensitive coating, especially preferred 30 to 50 wt.-%. If a mixture of different monomers without SH groups is used, the amounts given refer to the total amount of these monomers.

If additional C—C-unsaturated free-radical polymerizable compounds without SH groups are used, the SH-unsaturated monomers are preferably present in an amount of 2 to 35 wt.-%, based on the dry layer weight of the radiation-sensitive coating, especially preferred 5 to 15 wt.-%.

As another essential component, the radiation-sensitive coating of the lithographic printing plate precursor of the present invention comprises an initiator or an initiator system which upon irradiation can initiate the free-radical polymerization of the SH monomer and additional free-radical polymerizable monomers that can optionally be present. It depends on the type of initiator or initiator system whether the precursor according to the present invention can be imaged by means of UV radiation, visible (VIS) radiation or IR radiation.

Initiators which directly form free radicals upon absorption of UV radiation are well known to the person skilled in the art and are e.g. described in K. K. Dietliker: "Chemistry & Technology of UV&EB formulation for coatings, inks & prints", Vol. 3 (SITA Technology, London (1991)). They include for example oxime ethers and oxime esters, benzoins and benzoin ether, α-hydroxy or α-aminoacetophenones, peroxides (e.g. those listed in EP 035 435 A1 as an organic peroxide type activator), acylphosphine oxides and diacylphosphine oxides.

In the framework of the present invention, an initiator system comprising
 (a) a sensitizer which absorbs UV, VIS or IR radiation, but is not capable of forming free radicals by itself, and
 (b) a coinitiator which is essentially unable to absorb UV, VIS or IR radiation itself, but forms free radicals together with the sensitizer is especially preferred.

In the present invention, these initiator systems are divided into two groups: Those wherein the sensitizer absorbs radiation from the range of more than 750 to 1,200 nm (also briefly referred to as IR absorbers) and those wherein the sensitizer absorbs radiation from the range of 300 to 750 nm. If an initiator system of the former group is used, an IR-sensitive element is obtained, while the use of an initiator system of the latter group results in a UV- or VIS-sensitive element.

The optimum amount of sensitizer depends on various factors such as its extinction coefficient at the emitted wavelength, or the emitted wavelengths of the radiation source, the thickness of the radiation-sensitive layer of the radiation-sensitive element and its molar mass. Typically, they are used in amounts of 0.5 to 15 wt.-%, based on the dry layer weight of the radiation-sensitive coating. These values apply to initiator systems of both groups. Each initiator system has an optimum value for the molar ratio ($n_M$=Mol Sens: Mol Coinit) of sensitizer (Sens) and coinitiator (Coinit). It is usually between 0.1 and 2.

1,4-Dihydropyridines, oxazoles, bisoxazoles and analogues, coumarins and metallocenes can for example be used as UV- or VIS-absorbing sensitizers. Such sensitizers are e.g. described in DE 42 17 495 A1, DE 44 18 645 C1, DE 3 801 065 C2, EP 1 041 074 A1 and DD 287 796 A.

Compounds of formula (II) are preferably used as UV or VIS sensitizers of the 1,4-dihydropyridine type

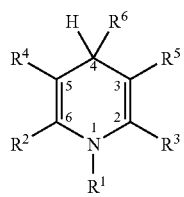
(II)

wherein $R^1$ is selected from a hydrogen atom, —C(O)OR$^7$, an optionally substituted alkyl group, an optionally substituted aryl group and an optionally substituted aralkyl group, $R^2$ and $R^3$ are independently selected from optionally substituted alkyl groups, optionally substituted aryl groups, CN and a hydrogen atom, $R^4$ and $R^5$ are independently selected from —C(O)OR$^7$, —C(O)R$^7$, —C(O)NR$^8$R$^9$ and CN, or $R^2$ and $R^4$ together form an optionally substituted phenyl ring or a 5- to 7-membered carbocyclic or heterocyclic ring, wherein the unit

is present in the carbocyclic or heterocyclic ring adjacent to position 5 of the dihydropyridine ring and wherein the carbocyclic or heterocyclic ring optionally comprises additional substituents, or both $R^2$ and $R^4$ as well as $R^3$ and $R^5$ form either optionally substituted phenyl rings or 5- to 7-membered carbocyclic or heterocyclic rings, wherein the unit

is present in the carbocyclic or heterocyclic rings adjacent to positions 3 and 5 of the dihydropyridine ring and wherein the carbocyclic or heterocyclic rings optionally comprise additional substituents, or one of the pairs $R^2/R^4$ and $R^3/R^5$ forms a 5- to 7-membered carbocyclic or heterocyclic ring, wherein the unit

is present in the carbocyclic or heterocyclic ring adjacent to position 5 or 3 of the dihydropyridine ring and wherein the carbocyclic or heterocyclic ring optionally comprises additional substituents and the other pair forms an optionally substituted phenyl ring, or $R^2$ and $R^1$ or $R^3$ and $R^1$ form a 5- to 7-membered heterocyclic ring which can optionally comprise one or more substituents and which, in addition to the nitrogen atom it shares with the 1,4-dihydropyridine ring, optionally comprises additional nitrogen atoms, —NR$^{13}$ groups, —S— or —O—, $R^{13}$ is selected from a hydrogen atom, an alkyl group, aryl group and aralkyl group, $R^6$ is selected from an alkyl group optionally substituted with a halogen atom or a —C(O) group, an optionally substituted aryl group, an optionally substituted aralkyl group, an optionally substituted heterocyclic group and the group

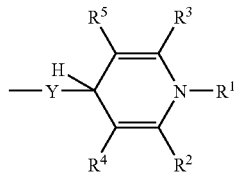

wherein

Y is an alkylene or arylene group, $R^7$ is a hydrogen atom, aryl group, aralkyl group or alkyl group, wherein the alkyl group and the alkyl unit of the aralkyl group optionally comprise one or more C—C double and/or C—C triple bonds, and $R^8$ and $R^9$ are independently selected from a hydrogen atom, an optionally substituted alkyl group, an optionally substituted aryl group and an optionally substituted aralkyl group.

According to a preferred embodiment, $R^1$ is a hydrogen atom.

If $R^2$ and $R^3$ do not form rings with adjacent substituents, they are preferably independently selected from $C_1$-$C_5$ alkyl groups or aryl groups.

If $R^4$ and $R^5$ do not form rings with adjacent substituents, they are preferably independently selected from —C(O)O$R^7$.

$R^6$ is preferably selected from $C_1$-$C_5$ alkyl groups or aryl groups.

$R^7$ is preferably selected from $C_1$-$C_5$ alkyl groups and it is especially preferred that it represents a methyl group.

According to one embodiment, the substitution of the 1,4-dihydropyridine ring with $R^2$/$R^4$ and $R^3$/$R^5$ is symmetrical, i.e. $R^2$=$R^3$ and $R^4$=$R^5$.

According to a preferred embodiment, $R^2$ and $R^3$ are independently selected from optionally substituted alkyl groups, optionally substituted aryl groups, CN and a hydrogen atom, and $R^4$ and $R^5$ are independently selected from —C(O)O$R^7$, —C(O)$R^7$, —C(O)N$R^8R^9$ and CN.

Specific 1,4-dihydropyridine derivatives are those of formula (IIa)

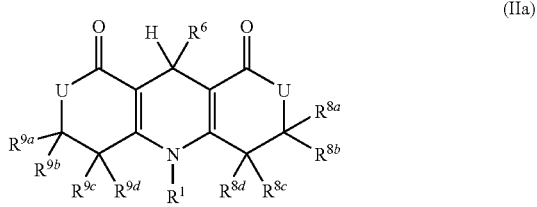

(IIa)

wherein $R^1$ and $R^6$ are as defined above, the groups $R^{8a}$ to $R^{8d}$ and $R^{9a}$ to $R^{9d}$ are independently selected from a hydrogen atom, alkyl groups and aryl groups, wherein two groups $R^9$ or $R^8$ of adjacent ring carbon atoms can also form a saturated or unsaturated carbocyclic or heterocyclic ring or fused aromatic ring together, each U is independently selected from $CR^{13}_2$, O, S and $NR^{13}$ and each $R^{13}$ independently represents a hydrogen atom, alkyl, aralkyl or aryl group, of formula (IIb)

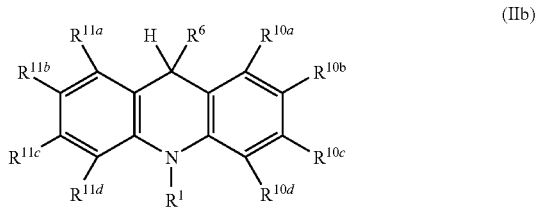

(IIb)

wherein $R^1$ and $R^6$ are as defined above, and $R^{10a}$ to $R^{10d}$ and $R^{11a}$ to $R^{11d}$ are independently selected from a hydrogen atom, alkyl groups, aryl groups, aralkyl groups, halogen atoms (fluorine, chlorine, bromine, iodine), CN, $NR^{13}_2$, C(O)O$R^{13}$ and O$R^{13}$ (each $R^{13}$ independently represents a hydrogen atom, an alkyl group, aryl group or aralkyl group), wherein two groups $R^{11}$ or $R^{10}$ of adjacent ring carbon atoms can also form an unsaturated carbocyclic or heterocyclic ring or fused aromatic ring together, of formula (IIc)

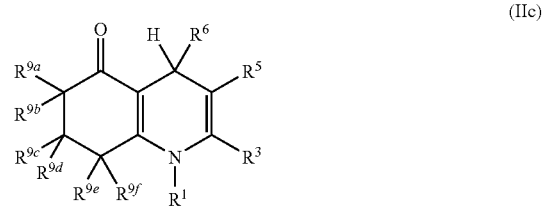

(IIc)

wherein $R^1$, $R^3$, $R^5$ and $R^6$ are as defined above and the groups $R^{9a}$ to $R^{9f}$ are independently selected from a hydrogen atom, alkyl groups, aryl groups, aralkyl groups, halogen atoms (fluorine, chlorine, bromine, iodine), CN, $NR^{13}_2$, C(O)O$R^{13}$ and O$R^{13}$ ($R^{13}$ independently represents a hydrogen atom, an alkyl group, aryl group or aralkyl group), wherein two groups $R^9$ of adjacent ring carbon atoms can also form a saturated or unsaturated carbocyclic or heterocyclic ring or fused aromatic ring together, of formula (IId)

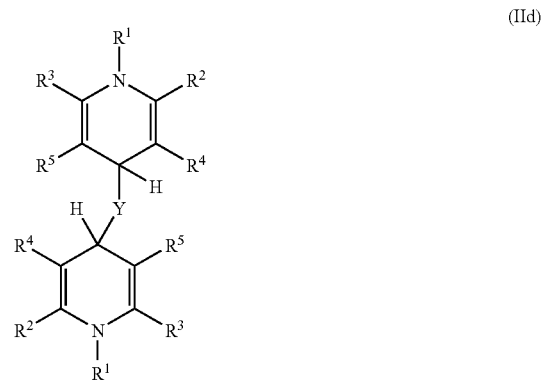

(IId)

wherein each $R^1$, $R^2$, $R^3$, $R^4$ and $R^5$ independently is as defined above and Y is selected from alkylene and arylene, of formula (IIe)

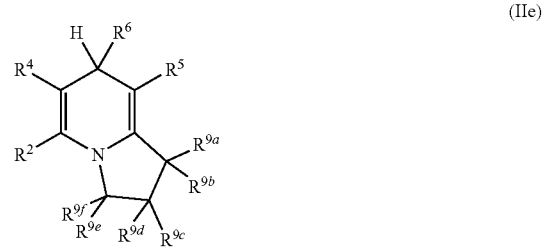

(IIe)

wherein $R^2$, $R^4$, $R^5$ and $R^6$ are as defined above and groups $R^{9a}$ to $R^{9f}$ are defined as are groups $R^{9a}$ to $R^{9d}$ of formula (IIa) above, of formula (IIf)

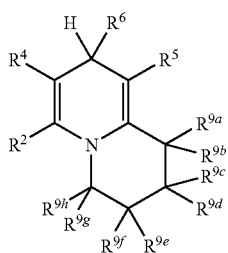

(IIf)

wherein $R^2$, $R^4$, $R^5$ and $R^6$ are as defined above and groups $R^{9a}$ to $R^{9h}$ are defined as are groups $R^{9a}$ to $R^{9d}$ of formula (IIa) above and of formula (IIg)

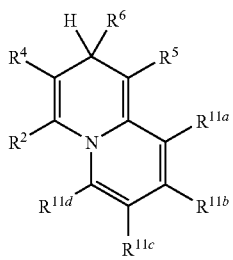

(IIg)

wherein $R^2$, $R^4$, $R^5$ and $R^6$ are as defined above and the groups $R^{11a}$ to $R^{11d}$ are independently selected from hydrogen, alkyl groups, aryl groups, aralkyl groups, halogen atoms (fluorine, chlorine, bromine, iodine), CN, $NR^{13}{}_2$, $C(O)OR^{13}$ and $OR^{13}$ ($R^{13}$ independently represents a hydrogen atom, an alkyl group, aryl group or aralkyl group), wherein two groups $R^{11}$ of adjacent ring carbon atoms can also form an unsaturated carbocyclic or heterocyclic ring or fused aromatic ring together.

It goes without saying that the number of groups $R^8$ or $R^9$ in formulas (IIa), (IIc), (IIe) and (IIf) is reduced if two groups $R^8$ or $R^9$ of adjacent ring carbon atoms together form a fused aromatic ring.

In the 1,4-dihydropyridine derivatives of formula (IIa), $R^1$ is preferably a hydrogen atom, $R^6$ is a methyl or phenyl group and U is preferably O or $CH_2$; the substituents $R^{8a}$ to $R^{8d}$ and $R^{9a}$ to $R^{9d}$ are independently preferably selected from hydrogen atoms and methyl groups. Of the derivatives of formula (IIa) those with symmetrical substitution at the dihydropyridine ring are especially preferred.

In the derivatives of formula (IIb), $R^1$ is preferably a hydrogen atom and $R^6$ is preferably a methyl or phenyl group. The substituents $R^{10a}$ to $R^{10d}$ and $R^{11a}$ to $R^{11d}$ are independently preferably selected from $C_1$-$C_5$ alkyl groups, $OR^{13}$ and halogen atoms; a symmetrical substitution of the two aromatic rings is especially preferred.

In the 1,4-dihydropyridine derivatives of formula (IIc), $R^1$ is preferably a hydrogen atom, $R^6$ is preferably a methyl or phenyl group, $R^3$ is preferably a methyl group and $R^5$ is preferably $C(O)OR^7$ (wherein $R^7$ is as defined above). The substituents $R^{9a}$ to $R^{9f}$ are independently preferably selected from $C_1$-$C_5$ alkyl groups; a methyl group is especially preferred.

In the derivatives of formula (IId), Y is preferably a 1,4-phenylene or 1,2-ethylene group. Furthermore, it is preferred that both groups $R^1$ be the same, both groups $R^2$ be the same, both groups $R^3$ be the same, both groups $R^4$ be the same and both groups $R^5$ be the same; the preferred definitions given with respect to formula (II) apply to all groups $R^1$ to $R^5$.

In the derivatives of formula (IIe), $R^2$ is preferably $C_1$-$C_5$ alkyl, $R^4$ is preferably —$C(O)OR^7$, $R^5$ is preferably $C(O)OR^7$ and $R^6$ is preferably a $C_1$-$C_5$ alkyl or phenyl group ($R^7$ is as defined above). The substituents $R^{9a}$ to $R^{9f}$ are preferably independently selected from $C_1$-$C_5$ alkyl groups.

In the derivatives of formula (IIf), $R^2$ is preferably $C_1$-$C_5$ alkyl, $R^4$ is preferably $C(O)OR^7$, $R^5$ is preferably $C(O)OR^7$ and $R^6$ is preferably a $C_1$-$C_5$ alkyl or a phenyl group (wherein $R^7$ is as defined above). The substituents $R^{9a}$ to $R^{9h}$ are preferably independently selected from $C_1$-$C_5$ alkyl groups.

In the derivatives of formula (IIg), $R^2$ is preferably $C_1$-$C_5$ alkyl, $R^4$ is preferably $C(O)OR^7$, $R^5$ is preferably $C(O)OR^7$ and $R^6$ is preferably a $C_1$-$C_5$ alkyl or a phenyl group. The substituents $R^{11}$ are preferably independently selected from $C_1$-$C_5$ alkyl groups.

Of the 1,4-dihydropyridine derivatives of formulas (IIa) to (IIg) those of formulas (IIa) and (IId) are especially preferred.

The 1,4-dihydropyridine derivatives used in the present invention can be prepared according to processes well known to the person skilled in the art, such as the Hantzsch synthesis. As an example, reference is made to J. Org. Chem. 30 (1965), p. 1914 et seqq., and *Angew. Chem.* [Applied Chemistry] (Intern.) 20 (1981), p. 762 et seqq.; the processes described therein can also be used for the synthesis of 1,4-dihydropyridines not explicitly disclosed therein by varying the starting compounds accordingly.

Compounds of formula (III) are preferably used as UV or VIS sensitizers of the oxazole type

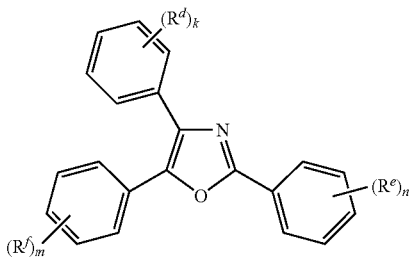

(III)

wherein each $R^d$, $R^e$ and $R^f$ is independently selected from a halogen atom, an optionally substituted alkyl group, an optionally substituted aryl group, which may also be fused, an optionally substituted aralkyl group, a group —NR'R" and a group —OR'", wherein R' and R" are independently selected from a hydrogen atom, an alkyl, aryl or aralkyl group, R'" is an optionally substituted alkyl, aryl or aralkyl group or a hydrogen atom, and k, m and n are independently 0 or an integer from 1 to 5.

Preferably, $R^d$, $R^e$ and $R^f$ are independently selected from a halogen atom, a $C_1$-$C_8$ alkyl and a group —NR'R", wherein R' and R" are preferably independently selected from hydrogen atoms and $C_1$-$C_6$ alkyl.

k, m and n are preferably independently 0 or 1.

Oxazole derivatives of formula (III), wherein at least one of $R^d$, $R^e$ and $R^f$ represents a group —NR'R" wherein R' and R"

are preferably independently selected from hydrogen atoms and $C_1$-$C_6$ alkyl, and especially preferred R'=R"=$C_1$-$C_6$ alkyl, are especially preferred.

The oxazole derivatives used in the present invention can be prepared according to processes well known to the person skilled in the art. In this connection, reference is made to DE 120 875 A1 and EP 0 129 059 A1; the processes described in these documents can also be used for the synthesis of oxazoles not explicitly described therein by varying the starting compounds accordingly.

According to the present invention, a compound of formula (IV) can also be used as UV or VIS sensitizer

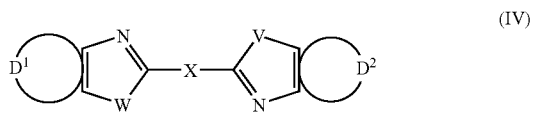
(IV)

wherein X is a spacer group comprising at least one C=C double bond conjugated to the heterocycles, $D^1$ and $D^2$ independently represent an optionally substituted fused aromatic ring and V and W are independently selected from O, S and NR, wherein R is selected from an alkyl, aryl and aralkyl group which can optionally be mono- or polysubstituted.

Preferably, V=W and represents O or NR.

R is preferably $C_1$-$C_{12}$ alkyl.

The spacer group X can be a chain-like or cyclic unit or a combination thereof. It is preferably selected from:

Phenylene, optionally comprising one or more benzofused aromatic rings (e.g. naphthylene), wherein the binding sites to the two heterocycles can be located at the same ring or at different rings,

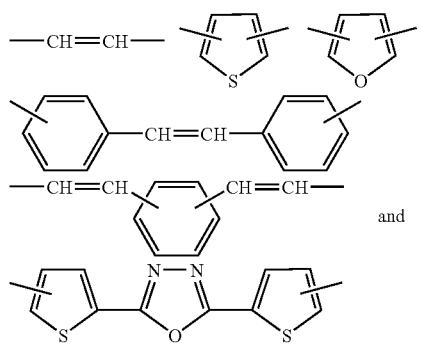

In the six-membered rings shown above, it is preferred that the binding sites be in the 1,4-position, in the five-membered rings, the 2,5-position is preferred. The five- and six-membered rings shown above can optionally comprise one or more substituents such as e.g. $C_1$-$C_{10}$ alkyl and halogen atoms, even if they are not shown in the above formulas.

$D^1$ and $D^2$ preferably represent fused aromatic rings which can optionally be substituted.

Preferred sensitizers of formula (IV) are represented by formulas (IVa), (IVb) and (IVc):

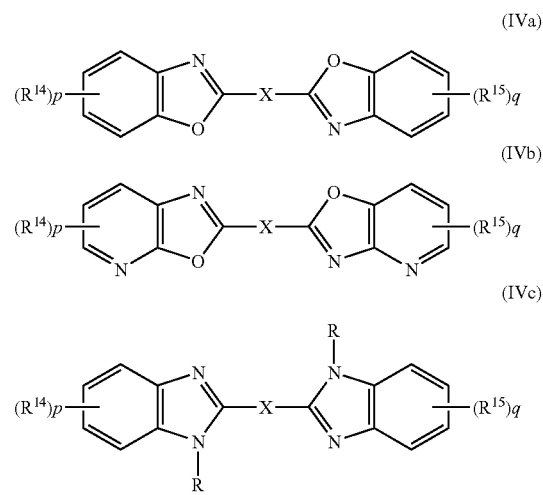

wherein p and q are independently an integer from 1 to 4, each group $R^{14}$ and $R^{15}$ is independently selected from a halogen atom, an alkyl, aryl, aralkyl, alkoxy, aryloxy, aralkyloxy group, a saturated or non-aromatic unsaturated carbocyclic ring, a fused aryl group, —$SO_3H$, —$NR^{16}_2$, —$COOR^{17}$ and —$COR^{17}$;

each group $R^{16}$ is independently a hydrogen atom or an alkyl group and each group $R^{17}$ is independently selected from a hydrogen atom, and alkyl and an aryl group, and X and R are as defined above.

$R^{14}$ and $R^{15}$ are preferably independently selected from —$NR^3_2$, an alkoxy group and an aryl group.

$R^{16}$ is preferably a $C_1$-$C_{10}$ alkyl group.

$R^{17}$ is preferably a $C_1$-$C_{10}$ alkyl group.

The sensitizers of formula (IV) used in the present invention can be prepared according to processes well known to the person skilled in the art. In this connection, reference is made to A. Dorlars et al., *Angew. Chemie* [Applied Chemistry], Vol. 87 (1975), 693-707; the processes described therein can also be used for the synthesis of compounds not explicitly disclosed therein by varying the starting compounds accordingly.

Titanocenes, especially preferred those with two five-membered cyclodienyl groups, such as e.g. cyclopentadienyl groups and one or two six-membered aromatic groups, having at least one ortho-fluorine atom and optionally also one pyrryl group, such as bis(cyclopentadienyl)-bis-[2,6-difluoro-3-(pyrr-1-yl)-phenyl]titanium and di-cyclopentadiene-bis-2,4,6-trifluorophenyl-titanium or zirconocenes, such as e.g. bis(cyclopentadienyl)-bis-[2,6-difluoro-3-(pyrr-1-yl)-phenyl]zirconium) can preferably be used as UV or VIS sensitizers of the metallocene type.

Coinitiators for UV or VIS-sensitive coatings of the lithographic printing plate precursors are for example selected from amines, such as alkanols amines; onium salts, such as e.g. ammonium salts, diaryliodonium salts, triarylsulfonium salts, aryldiazoniumsalts, phosphonium salts and N-alkoxypyridinium salts; N,N-dialkylaminobenzoic acid esters; N-arylglycines and derivatives thereof (e.g. N-phenylglycine); imides such as N-benzoyloxyphthalimide; diazosulfonates; 9,10-dihydroanthracene derivatives such as 9,10-dimethoxydihydroanthracene; N-aryl, S-aryl or O-aryl polycarboxylic acids with at least 2 carboxyl groups of which at least one is bonded to the nitrogen, oxygen or sulfur atom of the aryl unit (e.g. aniline diacetic acid and derivatives thereof and other coinitiators described in U.S. Pat. No. 5,629,354); a hexaarylbiimidazole such as e.g. those described in U.S. Pat. No. 3,552,973; and polyhalogenalkyl-substituted compounds. Of those compounds, the polyhalogenalkyl-substituted compounds are preferred in the present invention. In the present invention, borates are not used as coinitiators.

The term "polyhalogenalkyl-substituted compound" as used in the present invention refers to compounds comprising either one polyhalogenated or several monohalogenated alkyl substituents. The halogenated alkyl group preferably comprises 1 to 3 carbon atoms; a halogenated methyl group is especially preferred. Fluorine, chlorine and bromine atoms are preferably used as halogen atoms, with chlorine and bromine atoms being especially preferred.

Examples of especially suitable polyhalogenalkyl-substituted compounds for use in the precursors according to the present invention include: Trihalogenmethylarylsulfones and trihalogenmethylhatarylsulfones, such as e.g. tribromomethylphenylsulfone and tribromomethyl-2-pyridylsulfone; 2-phenyl-4,6-bis(trichloromethyl)-s-triazine, 2,4,6-tris (trichloromethyl)-s-triazine, 2-methyl-4,6-bis(trichloromethyl)-s-triazine, 2-(styryl-4,6-bis(trichloromethyl)-s-triazine, 2-(p-methoxystyryl)-4,6-bis(trichloromethyl)-s-triazine, 2-(4-methoxy-naphtho-1-yl)-4,6-bis-trichloromethyl-s-triazine, 2-(4-ethoxy-naphtho-1-yl)-4,6-bis(trichloromethyl)-s-triazine and 2-[4-(2-ethoxyethyl)-naphtho-1-yl]-4,6-bis(trichloromethyl)-s-triazine; other heterocycles with at least one $C(Hal)_3$ group, such as e.g. 2-trichloromethyl-benzoxazole, 2-trichloromethylbenzthiazole, 2-trichloromethyl-5-phenyl-1,3-oxazole; 1,2,3,4-tetrabromobutane.

The initiator system for IR-sensitive lithographic printing plate precursors comprises at least one IR absorber and one or more coinitiators.

In the present invention, the IR absorbers are preferably selected from the class of triarylamine dyes, thiazolium dyes, indolium dyes, oxazolium dyes, cyanine dyes, polyaniline dyes, polypyrrol dyes, polythiophene dyes and phthalocyanine dyes and pigments. However, other IR absorbers, e.g. those described in US 2002/0025489 A1, can be used as well.

Suitable IR absorbers include e.g. the following compounds:

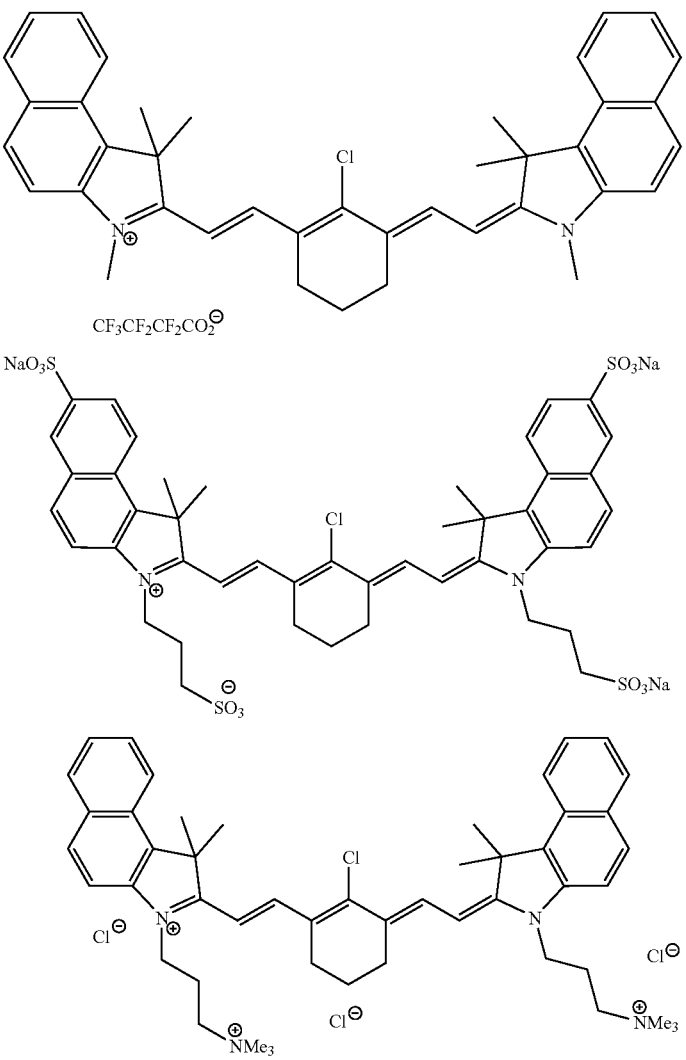

-continued
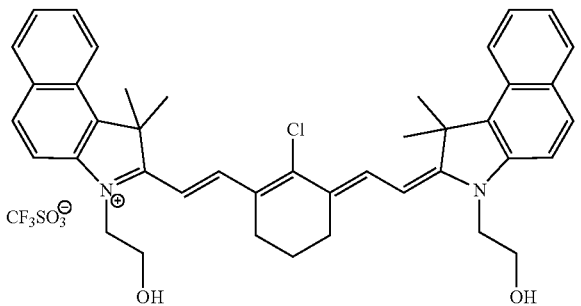
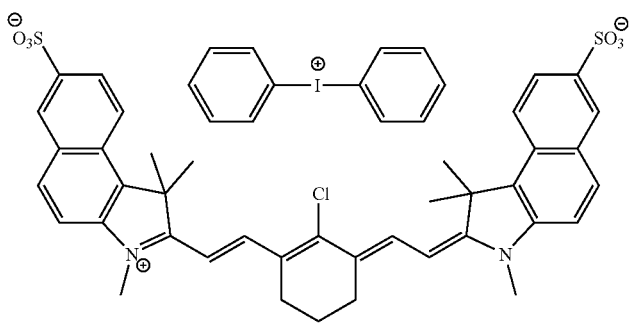
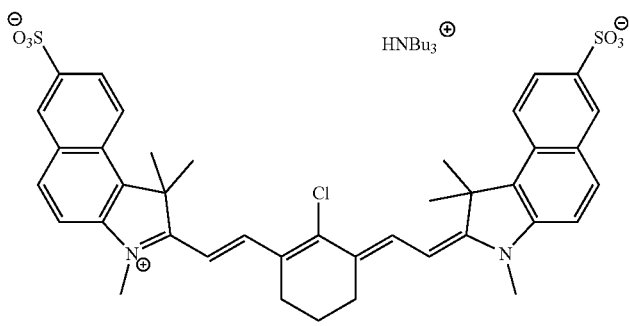
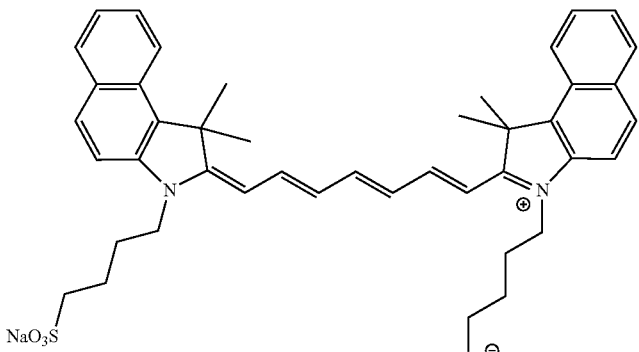
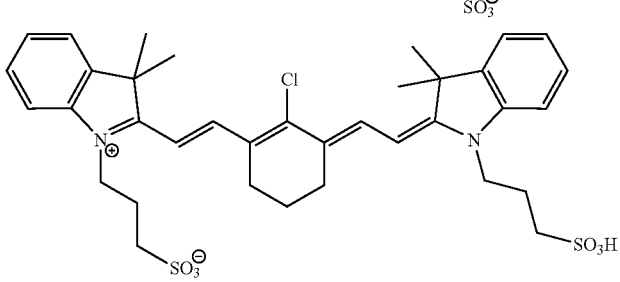

-continued
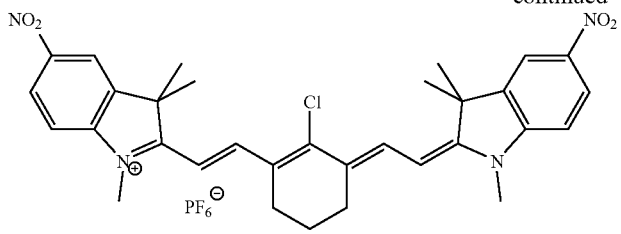
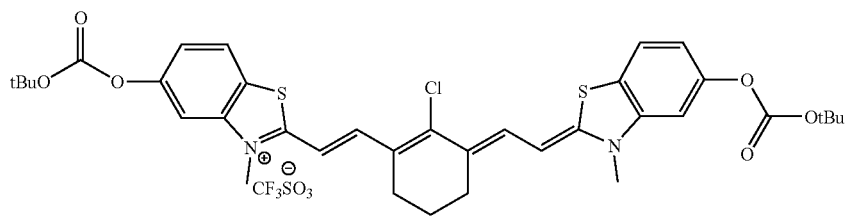
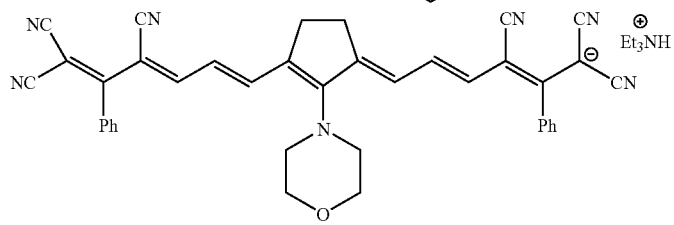
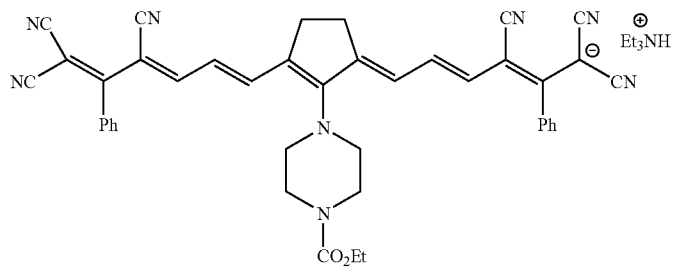
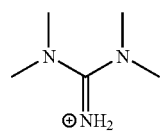
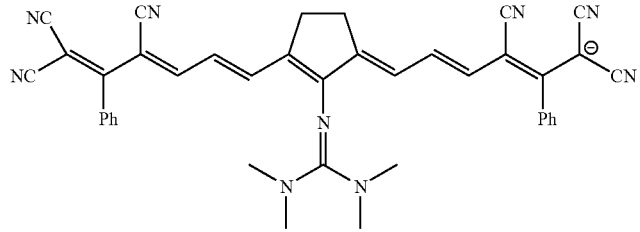
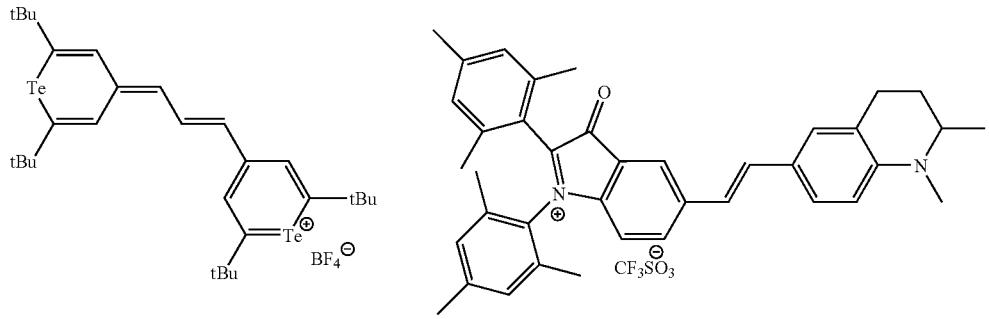

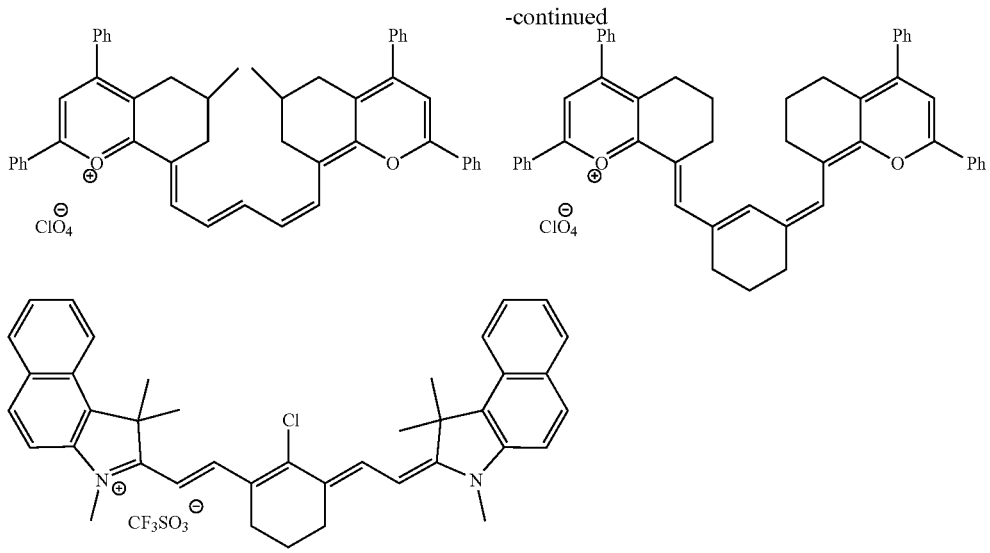

According to a preferred embodiment of the present invention, an IR absorber of formula (V) is used.

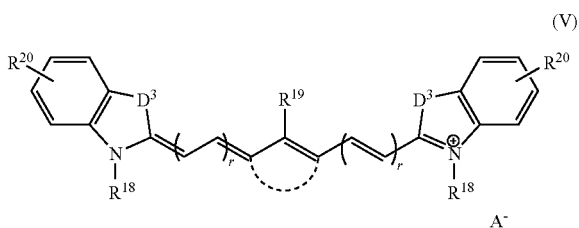

wherein
each $D^3$ independently represents S, O, $NR^{12}$ or $C(alkyl)_2$;
each $R^{18}$ independently represents an alkyl group;
$R^{19}$ represents a halogen atom, $SR^{12}$, $OR^{12}$ or $NR^{12}{}_2$;
each $R^{20}$ independently represents a hydrogen atom, an alkyl group, $OR^{12}$, $SR^{12}$ or $NR^{12}{}_2$ or a halogen atom; $R^{20}$ can also be a benzofused ring;
$A^-$ represents an anion;
- - - represents an optionally present carbocyclic five- or six-membered ring;
$R^{12}$ represents an alkyl or aryl group; in the case of $NR^{12}{}_2$, one group $R^{12}$ can also represent H;
each r can independently be 0, 1, 2 or 3.

These IR absorbers absorb in the range of 800 to 1,200 nm; those of formula (V) absorbing in the range of 810 to 860 nm are especially preferred.

$D^3$ is preferably a $C(alkyl)_2$ group, wherein the alkyl group preferably comprises 1 to 3 carbon atoms.

$R^{18}$ is preferably an alkyl group with 1 to 4 carbon atoms.

$R^{19}$ is preferably $SR^{12}$.

$R^{20}$ is preferably a hydrogen atom.

$R^{12}$ is preferably a phenyl group.

It is preferred that the dotted line represent a ring group with 5 or 6 carbon atoms.

The counterion $A^-$ is preferably a chloride ion or a tosylate anion.

IR absorbers with a symmetrical structure (V) are especially preferred.

Examples of especially preferred IR absorbers include 2-[2-[2-phenylsulfonyl-3-[2-(1,3-dihydro-1,3,3-trimethyl-2H-indole-2-ylidene)-ethylidene]-1-cyclohexene-1-yl]-ethenyl]-1,3,3-trimethyl-3H-indoliumchloride, 2-[2-[2-thiophenyl-3-[2-(1,3-dihydro-1,3,3-trimethyl-2H-indole-2-ylidene)-ethylidene]-1-cyclohexene-1-yl]-ethenyl]-1,3,3-trimethyl-3H-indoliumchloride, 2-[2-[2-thiophenyl-3-[2-(1,3-dihydro-1,3,3-trimethyl-2H-indole-2-ylidene)-ethylidene]-1-cyclopentene-1-yl]-ethenyl]-1,3,3-trimethyl-3H-indoliumtosylate, 2-[2-[2-chloro-3-[2-(1,3-dihydro-1,3,3-trimethyl-2H-benzo[e]-indole-2-ylidene)-ethylidene]-1-cyclohexene-1-yl]-ethenyl]-1,3,3-trimethyl-1H-benzo[e]-indolium-tosylate and 2-[2-[2-chloro-3-[2-ethyl-3H-benzthiazol-2-ylidene)-ethylidene]-1-cyclohexene-1-yl]-ethenyl]-3-ethyl-benzthiazolium-tosylate.

Polyhalogenalkyl-substituted compounds, onium salts and other compounds described in U.S. Pat. No. 6,309,792 B1 can preferably be used as coinitiators for IR-sensitive initiator systems. Especially suitable polyhalogenalkyl-substituted compounds and onium compounds have already been listed in connection with the coinitiators for the UV and VIS-sensitive initiator systems.

In order to increase the storage stability of IR-sensitive elements—if necessary—, the radiation-sensitive coating according to a preferred embodiment comprises at least one polycarboxylic acid, in particular polycarboxylic acids of the general formula (VI)

wherein
A is selected from O, S or $NR^{24}$, wherein $R^{24}$ represents a hydrogen atom, a $C_1$-$C_6$ alkyl group, a group $CH_2CH_2COOH$ or a $C_1$-$C_5$ alkyl group substituted with —COOH;
$R^{21}$, $R^{22}$ and $R^{23}$ are independently selected from a hydrogen atom, $C_1$-$C_6$ alkyl group, substituted or unsubstituted aryl group, —COOH or $NR^{25}CH_2COOH$, wherein $R^{25}$ is selected from —$CH_2COOH$, —$CH_2OH$ and —$(CH_2)N(CH_2)COOH$; and a is 0, 1, 2 or 3, with the proviso that A, $R^{21}$, $R^{22}$ and $R^{23}$ are selected such that the acid of formula (VI) comprises at least one further COOH group in addition to that shown in formula (VI).

N-aryl-polycarboxylic acids are especially preferred; in particular those of formula (VIa) below:

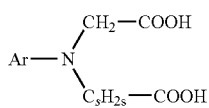

(VIa)

wherein Ar represents a mono- or polysubstituted or unsubstituted aryl group and s is an integer of 1 to 5, and of formula (VIb)

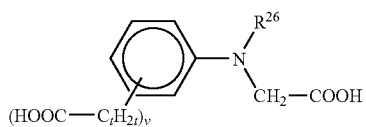

(VIb)

wherein $R^{26}$ represents a hydrogen atom or a $C_1$-$C_6$ alkyl group and t and v are each an integer from 1 to 5.

Possible substituents of an aryl group are $C_1$-$C_3$ alkyl groups, $C_1$-$C_3$ alkoxy groups, $C_1$-$C_3$ thioalkyl groups and halogen atoms. The aryl group can comprise 1 to 3 identical or different substituents.

Ar preferably represents a phenyl group.

In formula (VIb), v is preferably 1 and $R^{26}$ preferably represents a hydrogen atom.

Examples of such polycarboxylic acids include:
(4-Acetamidophenylimino)diacetic acid
3-(bis(carboxymethyl)amino)benzoic acid
4-(bis(carboxymethyl)amino)benzoic acid
2-[(carboxymethyl)phenylamino]benzoic acid
2-[(carboxymethyl)phenylamino]-5-methoxybenzoic acid
3-[bis(carboxymethyl)amino]-2-naphthalenecarboxylic acid
N-(4-aminophenyl)-N-(carboxymethyl)glycine
N,N'-1,3-phenylene-bisglycine
N,N'-1,3-phenylene-bis[N-(carboxymethyl)]glycine
N,N'-1,2-phenylene-bis[N-(carboxymethyl)]glycine
N-(carboxymethyl)-N-(4-methoxyphenyl)glycine
N-(carboxymethyl)-N-(3-methoxyphenyl)glycine
N-(carboxymethyl)-N-(3-hydroxyphenyl)glycine
N-(carboxymethyl)-N-(3-chlorophenyl)glycine
N-(carboxymethyl)-N-(4-bromophenyl)glycine
N-(carboxymethyl)-N-(4-chlorophenyl)glycine
N-(carboxymethyl)-N-(2-chlorophenyl)glycine
N-(carboxymethyl)-N-(4-ethylphenyl)glycine
N-(carboxymethyl)-N-(2,3-dimethylphenyl)glycine
N-(carboxymethyl)-N-(3,4-dimethylphenyl)glycine
N-(carboxymethyl)-N-(3,5-dimethylphenyl)glycine
N-(carboxymethyl)-N-(2,4-dimethylphenyl)glycine
N-(carboxymethyl)-N-(2,6-dimethylphenyl)glycine
N-(carboxymethyl)-N-(4-formylphenyl)glycine
N-(carboxymethyl)-N-ethylanthranilic acid
N-(carboxymethyl)-N-propylanthranilic acid
N-(carboxymethyl)-N-benzylglycine
5-bromo-N-(carboxymethyl)anthranilic acid
N-(2-carboxyphenyl)glycine
o-dianisidine-N,N, N',N'-tetraacetic acid
4-carboxyphenoxyacetic acid
catechol-O,O'-diacetic acid
4-methylcatechol-O,O'-diacetic acid
resorcinol-O,O'-diacetic acid
hydroquinone-O,O'-diacetic acid
α-carboxy-o-anisic acid
2,2'-(dibenzofuran-2,8-diyldioxy)diacetic acid
2-(carboxymethylthio)benzoic acid
5-amino-2-(carboxymethylthio)benzoic acid
3-[(carboxymethyl)thio]-2-naphthalenecarboxylic acid
ethylene diaminotetraacetic acid
nitrilotriacetic acid The most preferred polycarboxylic acid is anilino diacetic acid.

The polycarboxylic acid is preferably present in the radiation-sensitive coating in an amount of from 0 to 10 wt.-%, more preferably 1 to 10 wt.-% and especially preferred 1.5 to 3 wt.-%, based on the dry layer weight of the radiation-sensitive coating.

The radiation-sensitive coating can furthermore comprise one or more dyes absorbing in the visible range of the spectrum for coloring the coating; suitable dyes are those that dissolve well in the solvent or solvent mixture used for coating or are easily introduced in the disperse form of a pigment. If the coatings are UV or VIS-sensitive, the added dyes must not or not decisively influence the light absorption of the sensitizer used. Suitable contrast dyes include inter alia rhodamine dyes, triarylmethane dyes, anthraquinone pigments and phthalocyanine dyes and/or pigments. The dyes are preferably present in the radiation-sensitive composition in an amount of from 0 to 10 wt.-%, especially preferred in an amount of from 0.5 to 3 wt.-%, based on the dry layer weight.

The radiation-sensitive coating can furthermore comprise one or more plasticizers. Suitable plasticizers include inter alia dibutyl phthalate, triaryl phosphate and dioctyl phthalate. If one or more plasticizers are used, their total amount preferably accounts for 0 to 2 wt.-% based on the dry layer weight, especially preferred 0.25 to 1.8 wt.-%.

Further additives that may be present in the radiation-sensitive coating are surfactants such as non-ionic, anionic and cationic tensides and mixtures thereof. Examples of suitable tensides include sorbitol-tri-stearate, glycerol monostearate, polyoxyethylene nonylether, alkyl-di-(aminoethyl)-glycine, 2-alky-N-carboxyethyl-imidazoliumbetaine and perfluoro compounds. The total amount of surfactants is preferably in the range of 0 to 0.8 wt.-% based on the dry layer weight, especially preferred 0.05 to 0.5 wt.-%.

The lithographic printing plate precursors of the present invention can be produced as follows:

The optionally pretreated dry substrate is coated with the radiation-sensitive composition from organic solvents or solvent mixtures such that dry layer weights preferably in the range of 0.5 to 4 g/m², more preferably 0.8 to 3 g/m², are obtained. These values apply to all the radiation-sensitive compositions of the present invention, whether they are UV-, VIS- or IR-sensitive compositions. Common coating methods such as coating with doctor blades, spray coating, dip coating and spin coating can be used for this purpose.

According to a preferred embodiment, an oxygen-impermeable overcoat, as it is known in the art, is preferably applied on top of the radiation-sensitive layer, e.g. a layer of polyvinyl alcohol, polyvinyl alcohol/polyvinyl acetate copolymers, polyvinyl pyrrolidon, polyvinyl pyrrolidon/polyvinyl acetate copolymers, polyvinyl methylether, polyacrylic acid and gelatine. The dry layer weight of the oxygen-impermeable overcoat is preferably 0.1 to 4 g/m², more preferably 0.3 to 2 g/m².

Depending on their initiator system, the lithographic printing plate precursors of the present invention can be imaged with UV radiation, VIS radiation or IR radiation. During image-wise irradiation, the coating is hardened in the exposed areas and only the non-exposed areas are subsequently removed during developing.

If the sensitizer used in the element absorbs UV or VIS radiation, i.e. distinctly absorbs radiation of a wavelength in the range of 300 to 750 nm, and preferably exhibits an absorption maximum in its absorption spectrum in that range, image-wise exposure can be carried out by means of common lamps for these wavelengths such as carbon arc lamps, mercury lamps, xenon lamps and metal halogenide lamps or lasers or laser diodes known to the person skilled in the art. Laser radiation can be digitally controlled via a computer, i.e. it can be turned on or off so that an image-wise exposure of the precursors can be effected via stored digitized information in the computer. Lithographic printing plate precursors of that type are therefore referred to as computer-to-plate (CTP) printing plates.

If the sensitizer used in the element absorbs IR radiation, i.e. distinctly absorbs radiation of a wavelength in the range of more than 750 to 1,200 nm, and preferably exhibits an absorption maximum in its absorption spectrum in that range, image-wise exposure can be carried out by means of IR radiation sources. For instance, IR-sensitive lithographic printing plate precursors of the present invention can be imaged by means of semiconductor lasers or laser diodes emitting in the range of about 800 to 1,200 nm.

The image-wise exposed printing plate precursors are then developed with a commercially available aqueous alkaline developer, leaving the exposed areas on the substrate and removing the unexposed areas.

After image-wise exposure, i.e. prior to developing, a heat-treatment can be carried out at 50 to 180° C., preferably 90 to 150° C.

For certain applications, it is furthermore advantageous to increase the mechanical strength of the portions of the coating remaining after developing by subjecting them to a heat treatment (what is referred to as "baking") or a combination of baking and overall exposure (e.g. to UV light). For this purpose, prior to the treatment, the developed element is treated with a solution that protects the non-image areas such that the heat treatment does not cause these areas to accept ink. A solution suitable for this purpose is e.g. described in U.S. Pat. No. 4,355,096. Baking takes place at a temperature in the range of 150 to 250° C., preferably 170 to 220° C. This treatment can be carried out independently which radiation wavelength was used for imagewise exposure of the precursor.

The developed printing plates of the present invention are usually treated with a preservative ("gumming") after developing. The preservatives are aqueous solutions of hydrophilic polymers, such as e.g. polyvinyl alcohol or dextrins, wetting agents and other additives.

The use of mercapto-functionalized free-radical polymerizable monomers can markedly improve the radiation sensitivity. In the case of IR-sensitive elements of the present invention, the sensitivity can be improved by 50 to 100% compared with elements not comprising such SH monomers. In the case of IR-sensitive elements this increase in sensitivity can sometimes affect the storage stability. However, the storage stability problem can be solved by the simultaneous use of a polycarboxylic acid as described above; in such a case as well, there is a considerable improvement in sensitivity (by about 25 to 50%). The sensitivity of UV-sensitive elements of the present invention can be increased by about 20 to 60%.

The invention is described in more detail in the following examples.

PREPARATION EXAMPLE 1

Based on U.S. Pat. No. 6,569,603

2-Thio(4-ethenyl)benzyl-5-mercapto-1,3,4-thiadiazole 75 g (0.5 moles) 2,5-dimercapto-1,3,4-thiadiazole (available from Aldrich) were dispersed in 300 ml methanol and the suspension was externally cooled to 5° C. with ice. Then 50.5 g (0.5 moles) triethylamine were added under stirring while the temperature was held between 5 and 10° C. A clear, lightly colored solution was obtained to which 76.3 g (0.5 moles) 4-chloromethylstyrene (available from Aldrich) were added drop-wise under stirring for 15 minutes. Then the solution was stirred for 4 hours at room temperature. During that time, a precipitate formed which was filtered off, washed with water and dried in a vacuum oven for 1 day at 40° C. Yield: 103 g (77.4%).

For purification, 80 g of the isolated and dried product were dissolved in a solution of 16.8 g potassium hydroxide in 350 ml water. The small insoluble portion was removed by filtration and to the remaining clear solution 30 ml concentrated hydrochloric acid were added under stirring and cooling. The resulting precipitate was filtered off, washed with water and dried in a vacuum oven for 1 day at 40° C.

Elementary Analysis:

| calculated in % | | found in % | |
|---|---|---|---|
| C | 49.62 | C | 49.36 |
| H | 3.79 | H | 3.91 |
| N | 10.52 | N | 10.50 |
| S | 36.06 | S | 36.22 |

IR data (cm$^{-1}$):
3073, 2892, 1628

PREPARATION EXAMPLE 2

2-Thio(4-methylcrotonato)-5-mercapto-1,3,4-thiadiazole 15 g (0.1 moles) 2,5-dimercapto-1,3,4-thiadiazole (available from Aldrich) were dispersed in 60 ml methanol and the suspension was externally cooled to 5° C. with ice. Then 10.1 g (0.1 moles) triethylamine were added under stirring while the temperature was held between 5 and 10° C. 23.3 g (0.1 moles) methyl-4-bromocrotonate (80 wt.-% pure product, available from Lancaster) were added drop-wise under stirring for 15 minutes to the resulting clear, lightly colored solution. Then the solution was stirred for 14 hours at room temperature and 40 ml water were added under stirring. The resulting precipitate was filtered off, washed with water and dried in a vacuum oven for 1 day at 40° C. Yield: 23.7 g (85.9%).

IR data (cm$^{-1}$):
3053, 2855, 1703, 1655
Melting point: 100-102° C.

PREPARATION EXAMPLE 3

2-Thio(4-ethenyl)benzyl-4,6-dimercapto-1,3,5-triazine 18.6 g (0.1 moles) trithiocyanuric acid (available from Aldrich) were dispersed in 70 ml methanol and the suspension was externally cooled to 5° C. with ice. Then 10.1 g (0.1 moles) triethylamine were added under stirring for 30 minutes while the temperature was held between 5 and 10° C. To the resulting yellowish suspension were added drop-wise under stirring 15.3 g (0.1 moles) 4-chloromethylstyrene (available from Aldrich) for 15 minutes. Then the solution was stirred for 14 hours at room temperature. The resulting precipitate was filtered off, washed with water and dried in a vacuum oven for 1 day at 40° C. Yield: 25.5 g (84.4%)

IR data (cm$^{-1}$):
3035, 2901, 1627

PREPARATION EXAMPLE 4

2-Thiobenzyl-5-mercapto-1,3,4-thiadiazole 30 g (0.2 moles) 2,5-dimercapto-1,3,4-thiadiazole (available from Aldrich) were dispersed in 120 ml methanol and the suspension was externally cooled to 5° C. with ice. Then 20.2 g (0.2 moles) triethylamine were added under stirring while the temperature was held between 5 and 10° C. To the resulting clear, lightly colored solution were added drop-wise under stirring 25.2 g (0.2 moles) benzylchloride (available from Aldrich) for 15 minutes. Then the solution was stirred for 14 hours at room temperature and 70 ml water were added under stirring. The resulting precipitate was filtered off, washed with water and dried in a vacuum oven for 1 day at 40° C. Yield: 47 g (91.1%)

For purification, 36 g of the isolated and dried product were dissolved in a solution of 8.4 g potassium hydroxide in 150 ml water. The small insoluble portion was removed by filtration and to the remaining clear solution 15 ml concentrated hydrochloric acid were added under stirring and cooling. The resulting precipitate was filtered off, washed with water and dried in a vacuum oven for 1 day at 40° C.

Melting point: 112-115° C.

EXAMPLE 1

A coating solution was prepared from the following components:

6.3 g loncryl 683® (acrylic acid copolymer of the company SC Johnson & Son Inc. with an acid number of 175 mg KOH/g)

9.0 g AC 50® (methacrylic acid copolymer of the company PCAS/France with an acid number of 48 mg KOH/g, 70 wt.-% solution in ethylene glycol mono-methyl ether)

16.8 g of an 80% solution of a urethane acrylate in methyl ethyl ketone, prepared by reacting 1-methyl-2,4-bis-isocyanate benzene (Desmodur N100® of the company Bayer) with hydroxyethyl acrylate and pentaerythritol triacrylate having a double-bond content of 0.50 double bonds/100 g when all isocyanate groups are completely reacted 1.4 g dipentaerythritol pentaacrylate 1.8 g 2-thio(4-ethenyl)benzyl-5-mercapto-1,3,4-thiadiazole of Preparation Example 1

2.5 g 2-(4-methoxyphenyl)-4,6-bis-(trichloromethyl)-s-triazine 0.4 g Basonyl Violet 610 (Basic Violet 3, C.I.42555, available from Bayer)

0.45 g 2-[2-[2-thiophenyl-3-[2-(1,3-dihydro-1,3,3-trimethyl-2H-indole-2-ylidene)-ethylidene]-1-cyclohexene-1-yl]-ethenyl]-1,3,3-trimethyl-3H-indoliumchloride These components were dissolved under stirring in 200 ml of a mixture consisting of 90 parts by volume 1-methoxy-2-propanol and 10 parts by volume acetone After filtration of the solution, it was applied by means of common processes to an electrochemically grained and anodized aluminum foil that had been subjected to an after treatment with an aqueous solution of polyvinylphosphonic acid and the layer was dried for 4 minutes at 90° C. The dry weight of the resulting IR-sensitive layer was about 1.4 g/m$^2$.

Then an oxygen-impermeable layer with a dry layer weight of 2.0 g/m$^2$ was applied analogously by coating with a solution of the following composition:

7.5 g polyvinyl imidazole 42.5 g polyvinyl alcohol (Airvol 203® of the company Airproducts; 12 wt.-% residual acetyl groups)

170 g water

Drying took place for 5 minutes at 90° C.

The plate precursor produced in this manner was then exposed in a Trendsetter 3244 of the company Creo/Scitex with an 830 nm laser diode (20 W head, 3 W, different drum speeds). An UGRA/FOGRA Postscript test strip, version EPS, which contains different elements for evaluating the quality of the copies, was used for imaging.

The exposed printing plate precursor was processed in a Mercury News processor (Kodak Polychrome Graphics LLC) equipped with a preheating unit, a pre-wash unit, an immersion-type developing bath, a unit for rinsing with water, a gumming unit and a drying unit. The processor was filled with developer 980 from Kodak Polychrome Graphics LLC. The following settings were used:

| | |
|---|---|
| Speed | 120 cm/min |
| Preheating | 630 digits |
| Prewash rate | 0.5 l/m$^2$ plate |

Temperature of the developer bath 23 ± 1° C.

After this treatment, the exposed areas remained on the plate while the unexposed areas were completely removed by the developer.

The following criteria were examined for evaluating the copies obtained after heating and developing: The reproduction quality of 1-pixel elements, the optical density of checkerboard patterns of the pixel elements and the optical density of solids. A D19C/D196 densitometer (Gretag/Macbeth Colour Data Systems, Great Britain) was used for evaluating the contrast and the density of the solids and grid points.

The results regarding the energy requirements showed that an exposure energy of 31 mJ/cm$^2$ was sufficient for a good reproduction of solids, and an energy of 40 mJ/cm$^2$ was sufficient for 1-pixel elements.

A plate exposed with 40 mJ/m$^2$ was mounted in a sheet-fed offset press and used for printing with conventional printing ink. The image areas accepted the printing ink without any problems and the paper copies did not show any toning in the background areas. After 130,000 high-quality copies, printing was discontinued; however, the plate could have been used for more prints.

EXAMPLE 2

The coating solution of Example 1 was modified by replacing 2-[2-[2-thiophenyl-3-[2-(1,3-dihydro-1,3,3-trimethyl-2H-indole-2-ylidene)-ethylidene]-1-cyclohexene-1-yl]-ethenyl]-1,3,3-trimethyl-3H-indoliumchloride with 0.45 g IRT dye (available from Showa Denko K.K., Japan), which is a polymethine dye, and by replacing 1.8 g 2-thio(4-ethenyl)benzyl-5-mercapto-1,3,4-thiadiazole of Preparation Example 1 with 1.85 g 2-thio(4-ethenyl)benzyl-4,6-dimercapto-1,3,5-triazine of Preparation Example 3. The thus obtained composition was applied, exposed and developed as described in Example 1. The following exposure energy was necessary for good reproduction:

32 mJ/m² for solids and 42 mJ/m² for 1-pixel elements.

EXAMPLE 3

The coating solution of Example 1 was modified by replacing 1.8 g 2-thio(4-ethenyl)benzyl-5-mercapto-1,3,4-thiadiazole with 1.8 g 2-thio(4-(methylcrotonato))-5-mercapto-1,3,4-thiazole of Preparation Example 2. The coating composition was applied, exposed and developed as described in Example 1. The following exposure energy was necessary for good reproduction:

34 mJ/cm² for solids and 45 mJ/cm² for 1-pixel elements

EXAMPLE 4

The coating solution of Example 1 was modified by adding 0.45 g anilinodiacetic acid (available from Synton, Germany) and leaving out 1.4 g dipentaerythritol pentaacrylate. The coating composition was applied, exposed and developed as described in Example 1. The following exposure energy was necessary for good reproduction:

56 mJ/cm² for solids and 79 mJ/cm² for 1-pixel elements

In order to examine the storage stability of the plates, a rapid test of simulated ageing was carried out. For this purpose, the printing plate precursors were either heated to 60° C. in an incubator for 15 hours (in the following referred to as "dry-aged" plate precursor) or stored in a climatic chamber for 7 days at a temperature of 40° C. and a relative humidity of 80% (in the following referred to as "wet-aged" precursor). Then the IR sensitivity and printing results of these precursors were determined as described above. The unexposed areas of both types of aged precursors could be removed completely with the developer. The results regarding the energy requirements showed that an exposure energy of 61 mJ/cm² was necessary for a good reproduction of solids in the case of dry-aged precursors, and 66 mJ/cm² in the case of wet-aged precursors. A good reproduction of 1-pixel elements required 84 mJ/cm² (dry-aged) and 92 mJ/cm² (wet-aged), respectively.

Plates produced from wet-aged and dry-aged precursors and exposed with the exposure energy mentioned above were mounted in a sheet-fed offset press and used for printing. The image areas accepted the printing ink without any problems and the paper copies did not show any toning in the non-image areas. After 130,000 high-quality copies, printing was discontinued; however, both plates could have been used for more prints.

EXAMPLE 5

An electrochemically (in HCl) grained and anodized aluminum foil was subjected to a treatment with an aqueous solution of polyvinyl phosphonic acid (PVPA) and after drying was coated with a coating solution prepared from the following components.

2.1 g of a 30% solution of a terpolymer prepared by polymerization of 470 parts by weight styrene, 336 parts by weight methyl methacrylate and 193 parts by weight methacrylic acid in 1-methoxy-2-propanol 2.0 g 2-thio(4-ethenyl)benzyl-5-mercapto-1,3,4-thiadiazole of Preparation Example 1

6.9 g of an 80% methyl ethyl ketone solution of a urethane acrylate prepared by reacting Desmodur N 100® (available from Bayer) with hydroxyethyl acrylate and pentaerythritol triacrylate; amount of double bonds: 0.5 double bonds per 100 g when all isocyanate groups have completely reacted with the acrylates containing hydroxy groups 0.8 g ditrimethylolpropane tetraacrylate 4.4 g of a dispersion in 1-methoxy-2-propanol comprising 10 wt.-% copper phthalocyanine and 5 wt.-% of a polyvinylacetal binder comprising 39.9 mole-% vinyl alcohol groups, 1.2 mole-% vinyl acetate groups, 15.4 mole-% acetal groups derived from acetaldehyde, 36.1 mole-% acetal groups derived from butyric aldehyde and 7.4 mole-% acetal groups derived from 4-formylbenzoic acid 1.0 g 1,4-dihydro-2,6-dimethyl-3,5-di(methoxycarbonyl)-4-phenylpyridine 0.75 g 2,2-bis(2-chlorophenyl)-4,5,4',5'-tetraphenyl-2'H-[1,2]-biimidazole 115 ml 1-methoxy-2-propanol 90 ml methanol 130 ml methyl ethyl ketone The solution was filtered, applied onto the lithographic substrate and the coating was dried for 4 minutes at 90° C. The dry layer weight of the photopolymer layer was about 1.6 g/m².

An overcoat layer as described in Example 1 was applied onto the thus obtained samples; after drying at 90° C. for 4 minutes, the overcoat layer had a dry layer weight of about 2 g/m².

The printing plate precursor was exposed with a Ga-doped MH lamp with an energy of 3.4 mJ/cm² in a vacuum frame using a gray scale with a density range of 0.15 to 1.95, wherein the density increments amounted to 0.15 (UGRA gray scale).

Immediately after exposure, the plate was heated in an oven for 1 minute at 90° C.

Then, the exposed plate was treated for 30 seconds with the developer 952 from Kodak Polychrome Graphics LLC.

Then the developer solution was again rubbed over the surface for another 30 seconds using a tampon and then the entire plate was rinsed with water. After this treatment, the exposed portions remained on the plate. For the assessment of its photosensitivity, the plate was blackened in a wet state with printing ink.

The following photosensitivity results were obtained:

6 solid steps of the blackened gray scale.

Step 9 was the first step not to accept ink.

The printing plate exposed with 3.4 mJ/m² and developed as described above was mounted in a sheet-fed offset press and used for printing with an abrasive printing ink (Offset S 7184 from Sun Chemical; containing 10% calcium carbonate). After 50,000 copies, no abrasion was observed.

COMPARATIVE EXAMPLE 1

Example 1 was repeated without the addition of 2-thio(4-ethenyl)benzyl-5-mercapto-1,3,4-thiadiazole, and the resulting composition was applied, exposed and developed as described in Example 1. A minimum exposure energy of about 300 mJ/cm$^2$ was necessary to achieve a maximum density of solids, and about 350 mJ/cm$^2$ for a good reproduction of 1-pixel elements. This result indicates that the absence of a mercapto-substituted monomer compound with an ethylenically unsaturated double bond leads to a markedly lower sensitivity than in the compositions of the present invention.

COMPARATIVE EXAMPLE 2

Example 1 was repeated, but 2-thio-benzyl-5-mercapto-1,3,4-thiadiazole of Preparation Example 4 was used instead of 2-thio(4-ethenyl)benzyl-5-mercapto-1,3,4-thiadiazole and the resulting composition was applied, irradiated and developed as described in Example 1. A minimum energy of about 88 mJ/cm$^2$ was necessary for solids, and about 120 mJ/cm$^2$ for a good reproduction of 1-pixel elements. This shows that the use of a mercapto-substituted monomer compound without an ethylenically unsaturated double bond instead of a mercapto-substituted monomer compound with an ethylenically unsaturated double bond results in a markedly lower sensitivity.

COMPARATIVE EXAMPLE 3

Example 5 was repeated without the addition of 2-thio(4-ethenyl)benzyl-5-mercapto-1,3,4-thiadiazole and the resulting composition was applied to the lithographic substrate, exposed, heated and developed as described in Example 5. The following photosensitivity results were obtained:

3 solid steps of the blackened gray scale, step 6 was the first step not to accept ink.

This shows that the absence of a mercapto-substituted monomer compound with an ethylenically unsaturated double bond results in a much lower photosensitivity than that achieved with the compositions of the present invention.

The invention claimed is:
1. A lithographic printing plate precursor comprising
a) an untreated or pretreated substrate and
b) a radiation-sensitive coating comprising
   (i) at least one polymeric binder soluble or swellable in aqueous alkaline developers;
   (ii) at least one free-radical polymerizable monomer and/or oligomer comprising at least one non-aromatic C—C double bond and at least one SH group in the molecule; and
   (iii) a radiation-sensitive initiator or initiator system for free-radical polymerization comprising as least one IR absorber capable of absorbing radiation in the wavelength of more than 750 to 1,200 nm and at least one coinitiator selected from polyhalogenalkyl-substituted compounds, onium compounds and mixtures of a polyhalogenalkyl-substituted compound and an onium compound,
wherein component (ii) has the following formula (I):

wherein each $R^{1a}$, $R^{1b}$ and $R^{1c}$ is independently selected from H, $C_1$-$C_6$ alkyl, $C_2$-$C_8$ alkenyl, aryl, halogen, CN and COOR$^{1d}$, wherein $R^{1d}$ is H, $C_1$-$C_{18}$ alkyl, $C_2$-$C_8$ alkenyl, $C_2$-$C_8$ alkynyl or aryl; and Z is an aliphatic, heterocyclic or heteroaromatic spacer or a combination of two or more thereof, wherein Z can optionally comprise one or more additional SH groups and/or one or more additional non-aromatic C—C double bonds; and each $Z^1$ is independently selected from a single bond,

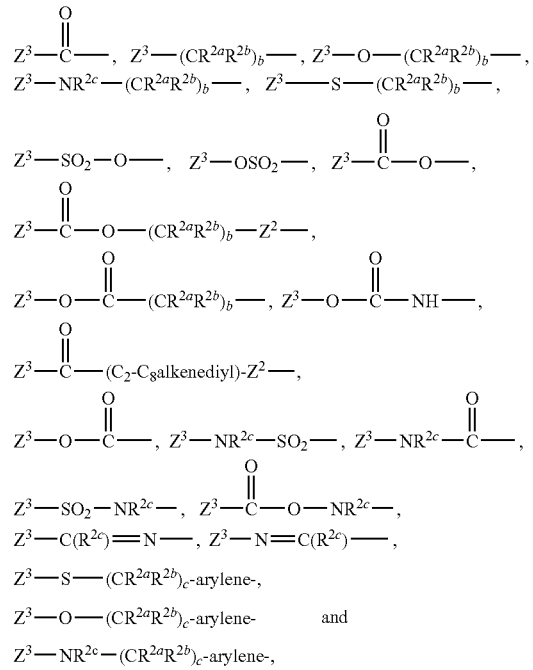

wherein $R^{2a}$, $R^{2b}$ and $R^{2c}$ are independently selected from H, $C_1$-$C_6$ alkyl and aryl, $Z^2$ is selected from a single bond, O, S and NR$^{2c}$, $Z^3$ is a single bond which is connected to Z, b is an integer from 1 to 10 and c is an integer from 1 to 3, wherein either: the component (ii) comprises two SH groups and one non-aromatic C—C double bond a molecule; or the component (ii) comprises one SH group and two or more non-aromatic C—C double bonds per molecule.

2. Lithographic printing plate precursor according to claim 1, wherein $R^{1a}$ is selected from H, CH$_3$ and COOH, $R^{1b}$ and $R^{1c}$ are independently H, CH$_3$ or —COOCH$_3$, p1 $R^{1d}$ represents H, CH$_3$ or —CH$_2$—CH═CR$_2$,

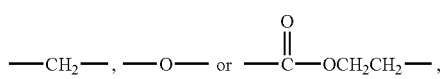

$Z^1$ is a single bond, c is 1,

Z is 1,3,5-triazine-2,4-diyl or 1,3,4-thiadiazole-2,5-diyl, $R^{2a}$, $R^{2b}$ and $R^{2c}$ are independently H or CH$_3$, and b represents 1 or 2.

3. Lithographic printing plate precursor according to claim 1 wherein the component (ii) is at least one compound selected from 2-thio(4-ethenyl)benzyl-5-mercapto-1,3,4-thiadiazole
2-thio(4-methylcrotonato)-5-mercapto-1,3,4-thiadiazole
2-thio(4-ethenyl)benzyl-4,6-dimercapto-1,3,5-triazine
2,4-di-thio(4-ethenyl)benzyl-6-mercapto-1,3,5-triazine
2-thio(4-methacroylmethylene)benzyl-5-mercapto-1,3,4-thiadiazole and
3-thio(4-ethenyl)benzyl-5-mercapto-1,2,4-triazole.

4. Lithographic printing plate precursor according to claim 1, wherein the radiation-sensitive coating furthermore comprises at least one free-radical polymerizable monomer and/or oligomer without SH groups.

5. Lithographic printing plate precursor according to claim 1, wherein the IR absorber is a cyanine dye of formula (V)

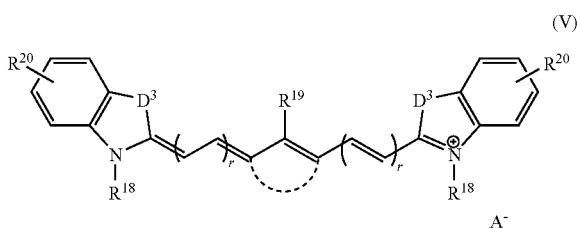

(V)

wherein
each $D^3$ independently represents S, O, $NR^{12}$ or $C(alkyl)_2$;
each $R^{18}$ independently represents an alkyl group;
$R^{19}$ represents a halogen atom, $SR^{12}$, $OR^{12}$ or $NR^{12}{}_2$;
each $R^{20}$ independently represents a hydrogen atom, an alkyl group, $OR^{12}$, $SR^{12}$ or $NR^{12}{}_2$ or a halogen atom; $R^{20}$ can also be a benzofused ring;
A– represents an anion;
— represents an optionally present carbocyclic five- or six-membered ring;
$R^{12}$ represents an alkyl or aryl group; in the case of $NR^{12}{}_2$, one group $R^{12}$ can also represent H;
each r can independently be 0, 1, 2 or 3.

6. Lithographic printing plate precursor according to claim 5, wherein the IR dye is 2-[2-[2-phenylsulfonyl-3-[2-(1,3-dihydro-1,3,3-trimethyl-2H-indole-2-ylidene)-ethylidene]-1-cyclohexene-1-yl]-ethenyl]-1,3,3-trimethyl-3H-indoliumchloride, 2-[2-[2-thiophenyl-3-[2-(1,3-dihydro-1,3,3-trimethyl-2H-indole-2-ylidene)-ethylidene]-1-cyclopentene-1-yl]-ethenyl]-1,3,3-trimethyl-3H-indoliumtosylate, 2-[2-[2-thiophenyl-3-[2-(1,3-dihydro-1,3,3-trimethyl-2H-indole-2-ylidene)-ethylidene]-1-cyclohexene-1-yl]-ethenyl]-1,3,3-trimethyl-3H-indoliumchloride, 2-[2-[2-chloro-3-[2-(1,3-dihydro-1,3,3-trimethyl-2H-benzo[e]-indole-2-ylidene)-ethylidene]-1-cyclohexene-1-yl]-ethenyl]-1,3,3-trimethyl-1H-benzo[e]-indolium-tosylate or 2-[2-[2-chloro-3-[2-ethyl-3H-benz-thiazole-2-ylidene)-ethylidene]-1-cyclohexene-1-yl]-ethenyl]-3-ethyl-benzthiazolium-tosylate.

7. Lithographic printing plate precursor according to claim 1 wherein the coinitiator is a polyhalogenalkyl-substituted compound selected from 2-phenyl-4,6-bis-(trichloromethyl)-s-triazine, 1,2,3,4-tetrabromo-n-butane, 2-(4-methoxyphenyl)-4,6-bis(trichloromethyl)-s-triazine, 2-(4-chlorophenyl)-4,6-bis(trichloro-methyl)-s-triazine, tribromomethylphenylsulfone, 2,4,6-tri(trichloromethyl)-s-triazine and 2,4,6-tri(tribromomethyl)-s-triazine.

8. A lithographic printing plate precursor comprising
a) an untreated or pretreated substrate and
b) a radiation-sensitive coating comprising
(i) at least one polymeric binder soluble or swellable in aqueous alkaline developers;
(ii) at least one free-radical polymerizable monomer and/or oligomer comprising at least one non-aromatic C—C double bond and at least one SH group in the molecule; and
(iii) a radiation-sensitive initiator or initiator system for free-radical polymerization capable of directly forming free radicals upon absorption of UV radiation,
wherein component (ii) has the following formula (I):

$$HS-Z-(Z^1-CR^{1a}=CR^{1b}R^{1c})_c \quad (I)$$

wherein each $R^{1a}$, is selected from H, $CH_3$, and COOH,
$R^{1b}$ and $R^{1c}$ is independently H, $CH_3$ and $—COOCH_3$;
$Z^1$ is a single bond, $—CH_2—$, $—O—$ or $—C—OCH_2CH_2—$,
c is 1,
Z is 1,3,5-triazine-2,4-diyl or 1,3,4-thiadiazole-2,5-diyl,
$R^{2a}$, $R^{2b}$ and $R^{2c}$ are independently H or $CH_3$, and
b represents 1 or 2.

9. The lithographic printing plate precursor according to claim 8, wherein the coating comprises an initiator system comprising at least one sensitizer capable of absorbing radiation in the range of 300 to 750 nm and at least one coinitiator incapable of absorbing radiation in the range of 300 to 750 nm by itself, but capable of forming free radicals together with the sensitizer.

10. Lithographic printing plate precursor according to claim 9, wherein the sensitizer is selected from 1,4-dihydropyridines, oxazoles, bisoxazoles and analogues thereof, coumarins and metallocenes.

11. Lithographic printing plate precursor according to claim 9, wherein the coinitiator is selected from amines, onium salts, N,N-dialkylaminobenzoic acid esters, N-arylglycines and derivatives thereof, diazosulfonates, 9,10-dihydroanthracene derivatives, N-aryl-, S-aryl- or O-aryl-polycarboxylic acids with at least two carboxyl groups, wherein at least one of which is bonded to the nitrogen, oxygen or sulfur atom of the aryl unit, a hexaarylbiimidazole and polyhalogenalkyl-substituted compounds.

12. Lithographic printing plate precursor according to claim 1, wherein the radiation-sensitive coating furthermore comprises at least one polycarboxylic acid.

13. Lithographic printing plate precursor according to claim 12, wherein the polycarboxylic acid has the formula (VI):

$$R^{21}—(CR^{22}R^{23})_a-A-CH_2COOH \quad (VI)$$

wherein
A is selected from O, S or $NR^{24}$, wherein $R^{24}$ represents a hydrogen atom, a $C_1$-$C_6$ alkyl group, a group $CH_2CH_2COOH$ or a $C_1$-$C_5$ alkyl group substituted with $—COOH$;
$R^{21}$, $R^{22}$ and $R^{23}$ are independently selected from a hydrogen atom, $C_1$-$C_6$ alkyl group, substituted or unsubstituted aryl group, $—COOH$ or $NR^{25}CH_2COOH$, wherein $R^{25}$ is selected from $—CH_2COOH$, $—CH_2OH$ and $—(CH_2)N(CH_2)COOH$; and
a is 0, 1, 2 or 3, with the proviso that A, $R^{21}$, $R^{22}$ and $R^{23}$ are selected such that the acid of Formula (VI) comprises at least one further COOH group in addition to that shown in Formula (VI).

14. Lithographic printing plate precursor according to claim 13, wherein the polycarboxylic acid is a compound of formula (VIa)

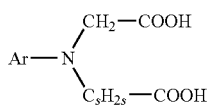

(VIa)

wherein Ar represents a mono- or polysubstituted or unsubstituted aryl group and s is an integer of 1 to 5, or a compound of formula (VIb),

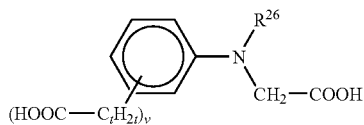

(VIb)

wherein $R^{26}$ represents a hydrogen atom or a $C_1$-$C_6$ alkyl group and t and v are each an integer from 1 to 5.

15. Lithographic printing plate precursor according to claim 1 wherein an oxygen-impermeable overcoat is provided on the radiation-sensitive coating.

16. Lithographic printing plate precursor according to claim 1 wherein the polymeric binder has an add number of >70 mg KOH/g polymer.

17. Process for producing a lithographic printing plate precursor as defined in claim 1 comprising:
(a) providing an untreated or pretreated substrate,
(b) applying a radiation-sensitive composition comprising
 (i) at least one polymeric binder soluble or swellable in aqueous alkaline developers;
 (ii) at least one free-radical polymerizable monomer and/or oligomer comprising at least one non-aromatic C—C double bond and at least one SH group in the molecule; and
 (iii) a radiation-sensitive initiator or initiator system for free-radical polymerization comprising as least one IR absorber capable of absorbing radiation in the wavelength of more than 750 to 1,200 nm and at least one coinitiator selected from polyhalogenalkyl-substituted compounds, onium compounds and mixtures of a polyhalogenalkyl-substituted compound and an onium compound,
wherein component (ii) has the following formula (I):

$$\text{HS-Z-}(Z^1\text{-}CR^{1a}{=}CR^{1b}R^{1c})_c \qquad (I)$$

wherein each $R^{1a}$, $R^{1b}$ and $R^{1c}$ is independently selected from H, $C_1$-$C_6$ alkyl, $C_2$-$C_8$ alkenyl, aryl, halogen, CN and $COOR^{1d}$, wherein $R^1$ is H, $C_1$-$C_{18}$ alkyl, $C_2$-$C_8$ alkenyl, $C_2$-$C_8$ alkynyl or aryl; and Z is an aliphatic, heterocyclic or heteroaromatic spacer or a combination of two or more thereof, wherein Z can optionally comprise one or more additional SH groups and/or one or more additional non-aromatic C—C double bonds; and each $Z^1$ is independently selected from a single bond,

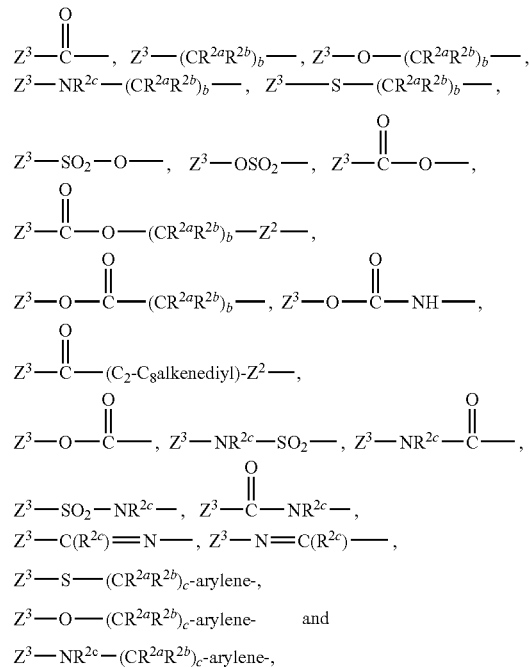

wherein $R^{2a}$ $R^{2b}$ and $R^{2c}$ are independently selected from H, $C_1$-$C_6$ alkyl and aryl, $Z^2$ is selected from a single bond, O, S and $NR^{2c}$, $Z^3$ is a single bond which is connected to Z, b is an integer from 1 to 10 and c is an integer from 1 to 3 wherein either: the component (ii) comprises two SH groups and one non-aromatic C—C double bond per molecule; or the component (ii) comprises one SH group and two or more non-aromatic C—C double bonds per molecule (c) drying and
(d) optionally applying an oxygen-impermeable overcoat and drying.

18. Process for providing a lithographic printing form comprising:
(a) providing a lithographic printing plate precursor as defined in claim 1,
(b) image-wise exposure of the precursor with radiation of a wavelength suitable for the initiator or initiator system used therein, and
(c) subsequent developing of the exposed precursor obtained in step (b) with an aqueous alkaline developer.

19. A lithographic printing plate precursor comprising
c) an untreated or pretreated substrate and
d) a radiation-sensitive coating comprising
 (i) at least one polymeric binder soluble or swellable in aqueous alkaline developers;
 (ii) at least one free-radical polymerizable monomer and/or oligomer comprising at least one non-aromatic C—C double bond and at least one SH group in the molecule; and
 (iii) a radiation-sensitive initiator or initiator system for free-radical polymerization,
wherein component (ii) has the following formula (I):

$$\text{HS-Z-}(Z^1\text{-}CR^{1a}{=}CR^{1b}R^{1c})_c \qquad (I)$$

wherein each $R^{1a}$, $R^{1b}$ and $R^{1c}$ is independently selected from H, $C_1$-$C_6$ alkyl, $C_2$-$C_8$ alkenyl, aryl, halogen, CN and COOR$^{1d}$, wherein R$^{1d}$ is H, C$_1$-C$_{18}$ alkyl, C$_2$-C$_8$ alkenyl, C$_2$-C$_8$ alkynyl or aryl; and Z is a 1,2,4-triazole group, 1,3,5-triazole group, or a combination of two or more thereof, wherein Z can optionally comprise one or more additional SH groups and/or one or more additional non-aromatic C—C double bonds; and each Z$^1$ is independently selected from a single bond,

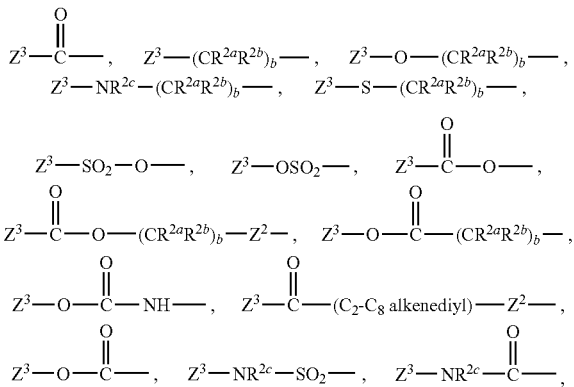

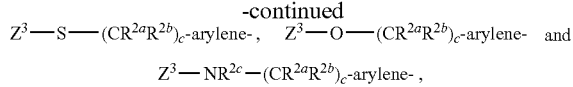

wherein R$^{2a}$, R$^{2b}$ and R$^{2c}$ are independently selected from H, C$_1$-C$_6$ alkyl and aryl, Z$^2$ is selected from a single bond, O, S and NR$^{2c}$, Z$^3$ is a single bond which is connected to Z, b is an integer from 1 to 10 and c is an integer from 1 to 3.

20. The lithographic printing plate precursor according to claim 19 wherein the component (ii) is 3-thio(4-ethenyl)benzyl-5-mercapto-1,2,4-triazole.

21. Process for providing a lithographic printing form comprising:

image-wise exposure of the lithographic printing plate precursor of claim 19 with radiation of a wavelength suitable for the initiator or initiator system used therein, and subsequently developing of the exposed precursor with an aqueous alkaline developer.

* * * * *